US008981352B2

(12) United States Patent
Yamada et al.

(10) Patent No.: US 8,981,352 B2
(45) Date of Patent: Mar. 17, 2015

(54) DISPLAY UNIT HAVING A GROOVE BETWEEN ORGANIC EL DEVICES

(75) Inventors: Jiro Yamada, Kanagawa (JP); Seiichi Yokoyama, Kanagawa (JP); Eiji Hasegawa, Kanagawa (JP); Atsuya Makita, Kanagawa (JP); Masanao Uesugi, Kanagawa (JP); Shoichi Gondo, Nagasaki (JP); Tomoyoshi Ichikawa, Kanagawa (JP); Junichi Yamashita, Tokyo (JP)

(73) Assignee: Sony Corporation (JP)

( * ) Notice: Subject to any disclaimer, the term of this patent is extended or adjusted under 35 U.S.C. 154(b) by 301 days.

(21) Appl. No.: 13/409,923

(22) Filed: Mar. 1, 2012

(65) Prior Publication Data

US 2012/0248475 A1     Oct. 4, 2012

(30) Foreign Application Priority Data

Mar. 31, 2011     (JP) .................. 2011-079619

(51) Int. Cl.
| | | |
|---|---|---|
| H01L 29/08 | (2006.01) | |
| H01L 21/00 | (2006.01) | |
| H01L 27/32 | (2006.01) | |
| H01L 27/146 | (2006.01) | |

(Continued)

(52) U.S. Cl.
CPC ........ *H01L 27/322* (2013.01); *H01L 27/14625* (2013.01); *H01L 27/3211* (2013.01); *H01L 2227/32* (2013.01); *H01L 2251/5338* (2013.01); *H01L 27/3246* (2013.01); *H01L 27/3258* (2013.01); *H01L 27/3272* (2013.01); *H01L 51/504* (2013.01); *H01L 51/5218* (2013.01); *H01L 51/5281* (2013.01); *H01L 51/5284* (2013.01); *H01L 2251/5315* (2013.01); *H01L 2251/558* (2013.01)
USPC .................. 257/40; 257/89; 257/98; 257/432; 438/28; 438/34; 438/82

(58) Field of Classification Search
CPC ............ H01L 27/3272; H01L 27/3258; H01L 27/322; H01L 27/3246; H01L 27/3248; H01L 25/0753; H01L 51/0545; H01L 51/504; H01L 2251/5338; H01L 2227/32; H01L 27/14625; H01L 27/3211; H01L 51/5281
See application file for complete search history.

(56) References Cited

U.S. PATENT DOCUMENTS

| | | | |
|---|---|---|---|
| 2004/0066136 A1* | 4/2004 | Yoneda et al. ................. 313/505 |
| 2007/0114532 A1* | 5/2007 | Yamazaki et al. .............. 257/59 |
| 2007/0200983 A9* | 8/2007 | Inoue et al. .................... 349/113 |
| 2009/0079336 A1* | 3/2009 | Yamada et al. ............... 313/504 |

(Continued)

FOREIGN PATENT DOCUMENTS

| | | |
|---|---|---|
| JP | H11-097171 | 4/1999 |
| JP | H11-307243 | 11/1999 |

(Continued)

OTHER PUBLICATIONS

Official Action (no English translation available) for Japanese Patent Application No. 2011-079619 mailed Dec. 24, 2014, 5 pages.

*Primary Examiner* — Alonzo Chambliss
(74) *Attorney, Agent, or Firm* — Sheridan Ross P.C.

(57) ABSTRACT

A display unit includes, on a substrate, a plurality of organic EL devices, and an insulating film provided in an inter-device region between the plurality of organic EL devices, the insulating film including a groove in a position between the organic EL devices adjacent to each other.

18 Claims, 35 Drawing Sheets

(51) Int. Cl.
  *H01L 51/50* (2006.01)
  *H01L 51/52* (2006.01)

(56) References Cited

U.S. PATENT DOCUMENTS

2010/0044690 A1* 2/2010 Okutani et al. .................. 257/40
2014/0151672 A1* 6/2014 Yamada et al. .................. 257/40

FOREIGN PATENT DOCUMENTS

| | | |
|---|---|---|
| JP | H11-307268 | 11/1999 |
| JP | 2000-195668 | 7/2000 |
| JP | 2005-085501 | 3/2005 |
| JP | 2009-004347 | 1/2009 |
| JP | 2010-073700 | 4/2010 |
| JP | 2010-097697 | 4/2010 |

* cited by examiner

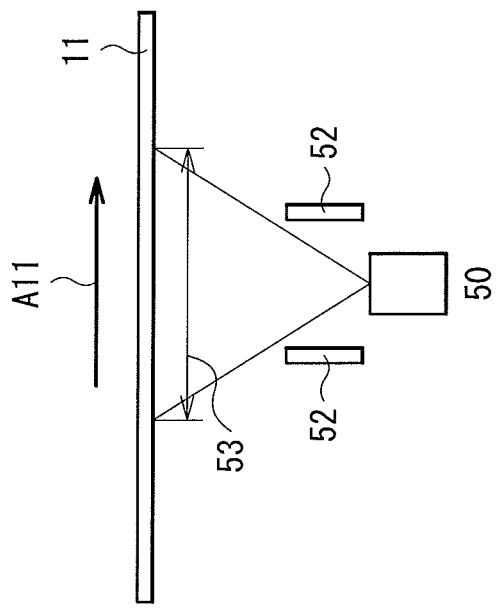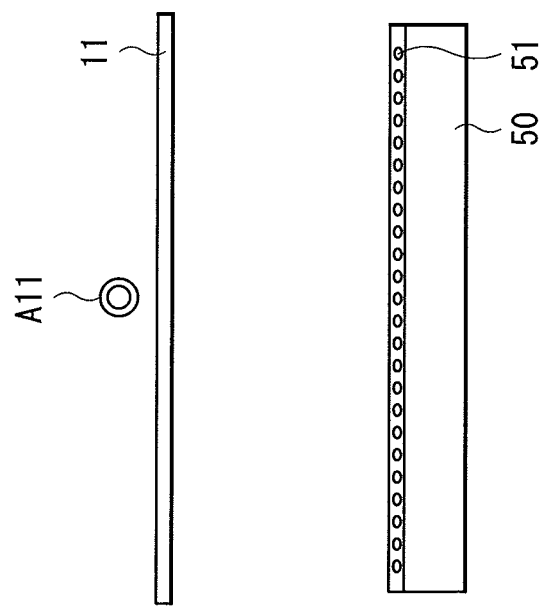
FIG. 20

| | | FIRST EMBODIMENT | THIRD EMBODIMENT | |
|---|---|---|---|---|
| | | | L=1.0μm | L=2.4μm |
| MgAg THICKNESS | R1 | R2 | | |
| 4nm | 85Ω | ∞ | 743Ω | 310Ω |
| 5nm | 42.5Ω | ∞ | 371.5Ω | 155Ω |
| 6nm | 28.33Ω | ∞ | 247.67Ω | 103.33Ω |
| 7nm | 21.25Ω | ∞ | 185.75Ω | 77.5Ω |
| 8nm | 18.21Ω | ∞ | 159.21Ω | 66.43Ω |

FIG. 29

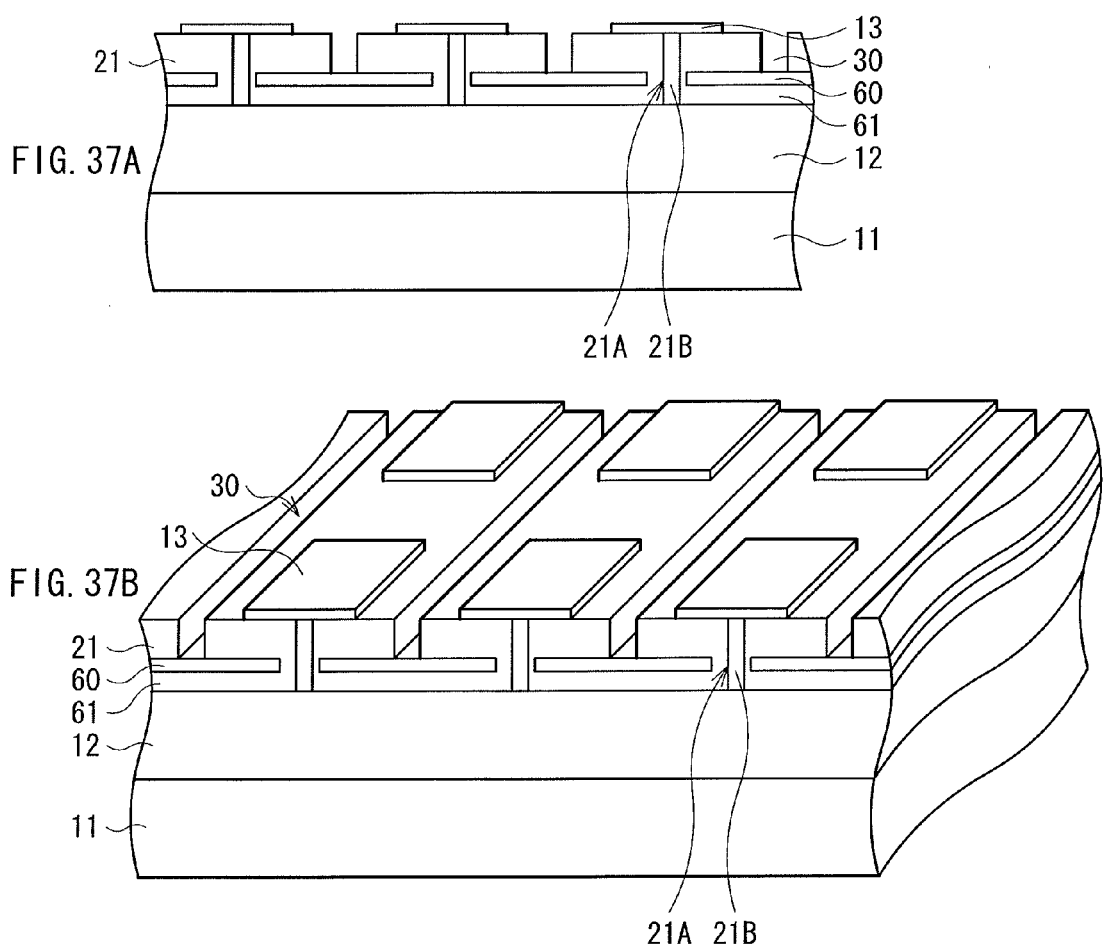

DISPLAY UNIT HAVING A GROOVE BETWEEN ORGANIC EL DEVICES

CROSS REFERENCES TO RELATED APPLICATIONS

The present application claims priority to Japanese Priority Patent Application JP 2011-079619 filed in the Japan Patent Office on Mar. 31, 2011, the entire content of which is hereby incorporated by reference.

BACKGROUND

The present disclosure relates to a display unit having an organic EL (electroluminescence) device and a method of manufacturing the same.

Organic EL devices have a configuration in which a first electrode, an organic layer including a light emitting layer, and a second electrode are sequentially layered on a substrate. Examples of methods of forming the organic layer include a method of separately evaporating a red light emitting layer, a green light emitting layer, and a blue light emitting layer by using an evaporation mask and a method of layering the red light emitting layer, the green light emitting layer, and the blue light emitting layer without using the evaporation mask. In the display units expected to have high resolution and improved aperture ratio, the latter method may be mainstream in the future.

In the method of layering a plurality of light emitting layers, the organic layer is provided commonly to all organic EL devices. Therefore, drive current leakage between adjacent organic EL devices through a hole injection layer occurs. Thereby, a non-light emitting pixel slightly emits light being influenced by a light emitting pixel, which causes color mixture and lowered efficiency. To address such a disadvantage, for example, in Japanese Unexamined Patent Application Publication No. 2009-4347, in a region between organic EL devices, an inverse-tapered-shaped dividing wall is formed and a hole injection layer is subsequently formed, and thereby the hole injection layer is sectioned in parts.

SUMMARY

In the existing method described in Japanese Unexamined Patent Application Publication No. 2009-4347, after the hole injection layer is formed, heat treatment is performed to deform the dividing wall in a forward-tapered shape in order not to section a second electrode in parts in forming the second electrode on the dividing wall. However, there has been a disadvantage that in the case where heat treatment is performed in the course of an evaporation step, characteristics are deteriorated in a higher rate.

It is desirable to provide a display unit capable of suppressing drive current leakage between adjacent organic EL devices without lowering characteristics and a method of manufacturing the same.

According to an embodiment of the present disclosure, there is provided a display unit including, on a substrate a plurality of organic EL devices, and an insulating film provided in an inter-device region between the plurality of organic EL devices, the insulating film including a groove in a position between the organic EL devices adjacent to each other.

In the display unit of the embodiment of the disclosure, the insulating film is provided in the inter-device region between the plurality of organic EL devices. The insulating film has a groove in a position between the organic EL devices adjacent to each other. Therefore, the thickness inside the groove of a layer having higher conductivity out of the organic layer such as a hole injection layer and a hole transport layer is smaller than the thickness outside the groove thereof, and resistance inside the groove thereof is increased. Therefore, drive current leakage between the organic EL devices adjacent to each other is suppressed.

According to an embodiment of the present disclosure, there is provided a method of manufacturing a display unit, the method including forming a plurality of organic EL devices on a substrate, and forming an insulating film in an inter-device region between the plurality of organic EL devices. In the forming of the insulating film, a groove is provided in a position between the organic EL devices adjacent to each other of the insulating film.

According to the display unit of the embodiment of the disclosure or the method of manufacturing a display unit of the embodiment of the disclosure, the insulating film is provided in the inter-device region between the plurality of organic EL devices. The groove is provided in the position between the organic EL devices adjacent to each other of the insulating film. Therefore, drive current leakage between the organic EL devices adjacent to each other is suppressed. Further, it is not necessary to perform the existing heat treatment, and accordingly, characteristics are allowed not to be deteriorated.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the present disclosure, and are incorporated in and constitute a part of this specification. The drawings illustrate embodiments and, together with the specification, serve to explain the principles of the technology.

FIG. 20 is a view illustrating a configuration viewed in a substrate movement direction and in a direction perpendicular thereto of the linear evaporation method illustrated in FIG. 19.

FIG. 29 is a diagram illustrating a simulation result of resistance in the column direction and resistance in a row direction of the second electrode.

FIGS. 37A and 37B are a perspective view and a cross-sectional view illustrating a step following the step in FIG. 36D.

DETAILED DESCRIPTION

Embodiments of the present disclosure will be hereinafter described in detail with reference to the drawings. The description will be given in the following order.

1. First embodiment (example that a groove is provided in a position between adjacent organic EL devices, in an insulating film)
2. Second embodiment (example that in a step of forming an organic layer, position relation between a groove on a substrate and an evaporation source is defined)
3. Third embodiment (example that a groove is provided for each row of a plurality of organic EL devices in a column direction)
4. Fourth embodiment (example that width of a groove is changed in a two-step manner)
5. Fifth embodiment (example that a conductive film is provided on a bottom surface of a groove)

Figure 1:
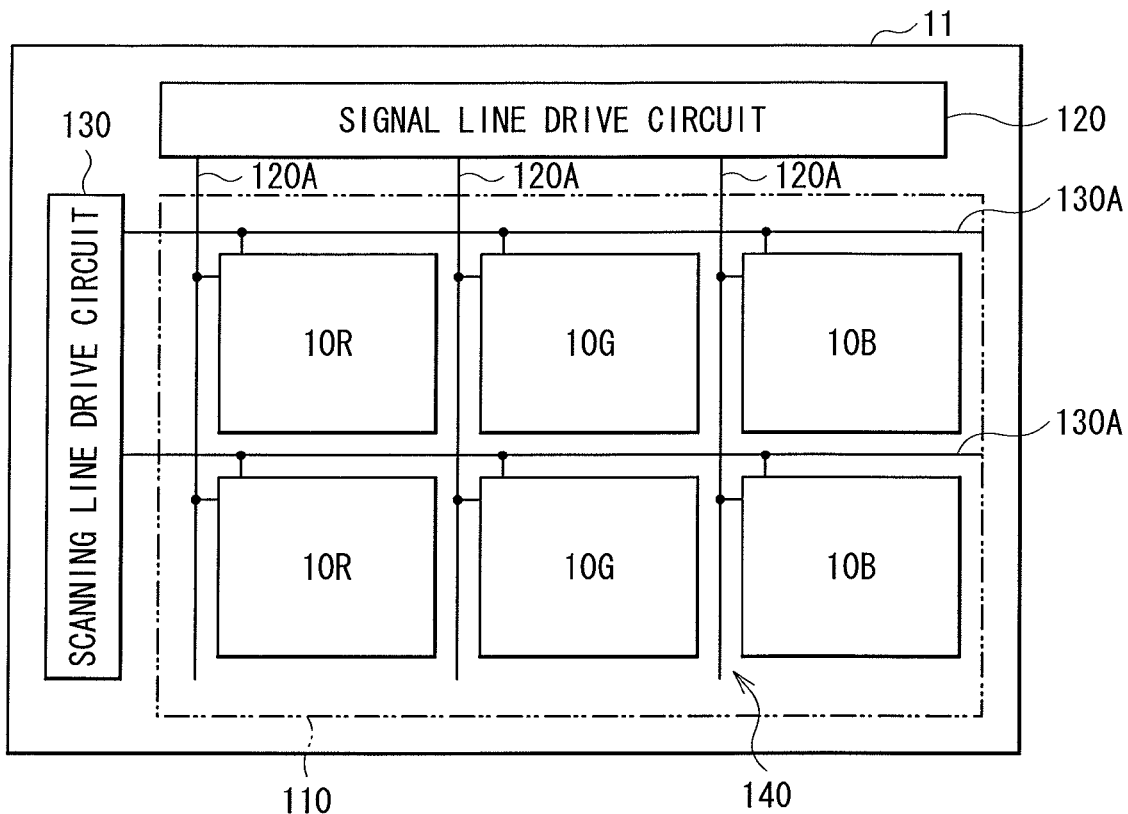
FIG. 1 is a diagram illustrating a configuration of a display unit according to a first embodiment of the present disclosure.

FIG. 1 illustrates a configuration of a display unit according to a first embodiment of the present disclosure. The display unit is a small high-definition organic EL display unit used for a viewfinder of a digital single-lens reflex camera, a head-mounted display, and the like. The display unit is, for example, provided with a display region 110 in which a plurality of organic EL devices 10R, 10G, and 10B described later are arranged in a matrix state on a substrate 11 made of glass or the like. A signal line drive circuit 120 and a scanning line drive circuit 130 that are drivers for displaying a video are provided on the periphery of the display region 110.

Figure 2:
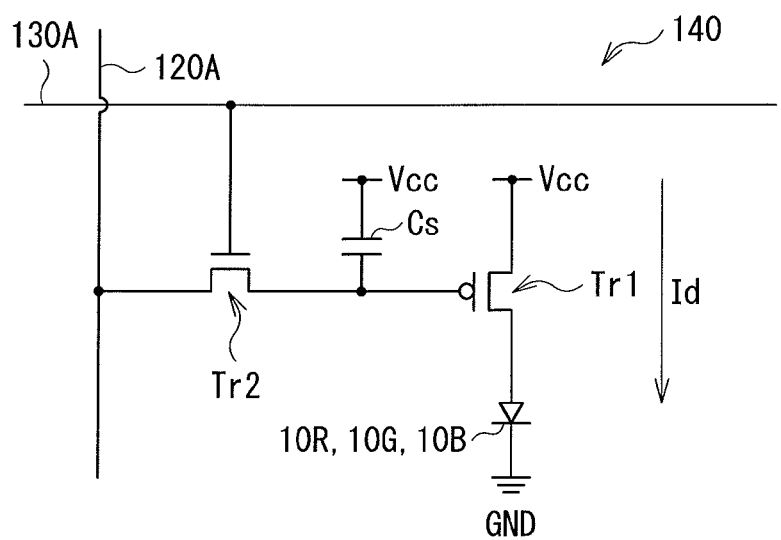
FIG. 2 is a diagram illustrating an example of a pixel drive circuit illustrated in FIG. 1.

In the display region 110, a pixel drive circuit 140 is provided. FIG. 2 illustrates an example of the pixel drive circuit 140. The pixel drive circuit 140 is an active drive circuit that is formed in a layer located lower than an after-mentioned first electrode 13. The pixel drive circuit 140 has, for example, a drive transistor Tr1, a writing transistor Tr2, a capacitor (retentive capacitance) Cs, and the organic EL device 10R (or 10G/10B) serially connected to the drive transistor Tr1 between a first power line (Vcc) and a second power line (GND). One electrode of the capacitor Cs is connected between the drive transistor Tr1 and the writing transistor Tr2, and the other electrode of the capacitor Cs is connected between the drive transistor Tr1 and the organic EL device 10R (or 10G/10B).

In the pixel drive circuit 140, a plurality of signal lines 120A are arranged in the column direction, and a plurality of scanning lines 130A are arranged in the row direction. Each cross section of each signal line 120A and each scanning line 130A corresponds to one of the organic EL devices 10R, 10G, and 10B (sub-pixel). Each signal line 120A is connected to the signal line drive circuit 120. An image signal is supplied to a source electrode of the writing transistor Tr2 from the signal line drive circuit 120 through the signal line 120A. Each scanning line 130A is connected to the scanning line drive circuit 130. A scanning signal is sequentially supplied to a gate electrode of the writing transistor Tr2 from the scanning line drive circuit 130 through the scanning line 130A.

Figure 3:
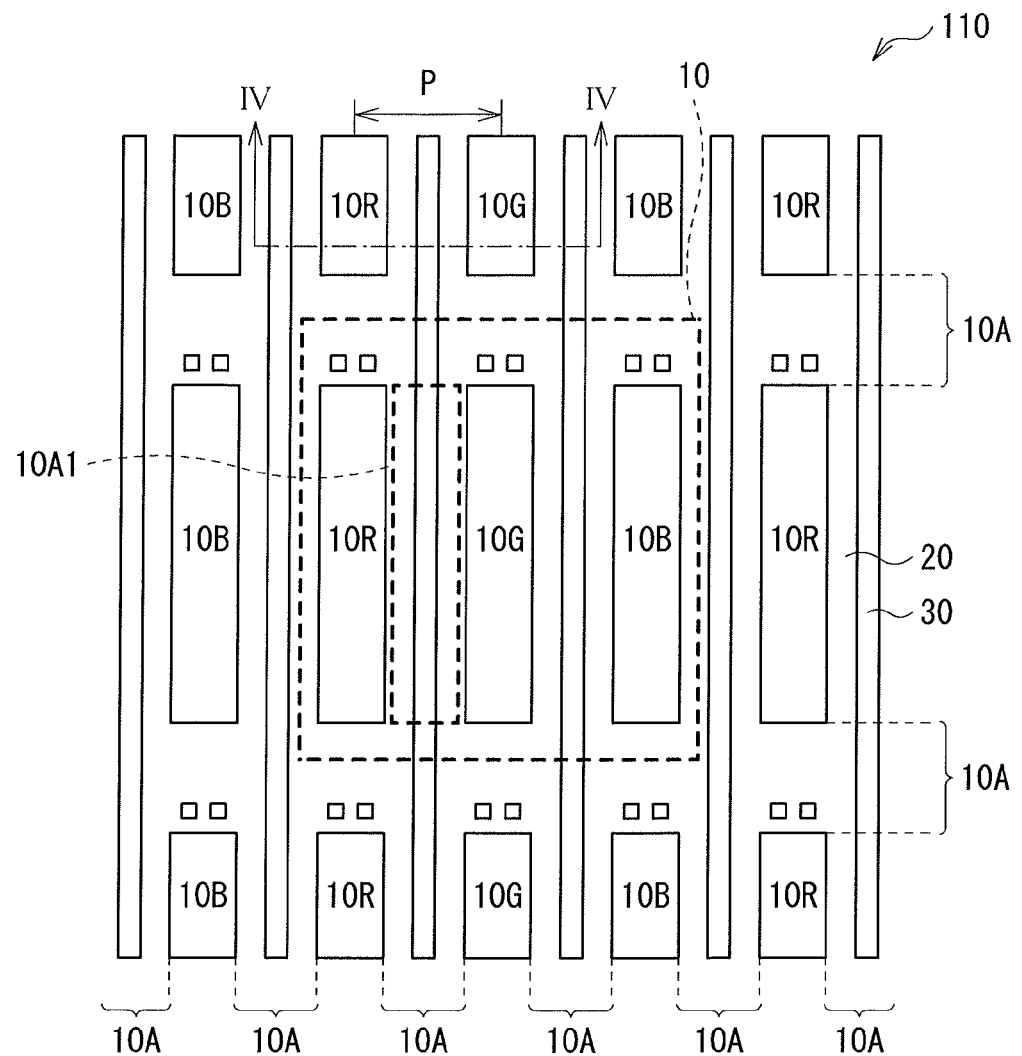
FIG. 3 is a plan view illustrating a configuration of a display region illustrated in FIG. 1.

FIG. 3 illustrates a planar configuration of part of the display region 110 illustrated in FIG. 1. The plurality of organic EL devices 10R, 10G, and 10B are arranged in a matrix state on the substrate 11. The respective organic EL devices 10R, 10G, and 10B have a rectangle shape with a long side in one direction. In a row direction parallel with a short side thereof, the organic EL devices 10R, 10G, and 10B with different colors are arranged in order. In the column direction parallel with a long side thereof, the organic EL devices 10R (or 10G/10B) with the same color are arranged.

Three organic EL devices 10R, 10G, and 10B adjacent to each other compose one pixel 10. The respective organic EL devices 10R, 10G, and 10B compose one sub-pixel. Pitch (center distance) p in the row direction of the plurality of organic EL devices 10R, 10G, and 10B is, for example, equal to or smaller than 30 μm. Specifically, one pixel 10 is a square having, for example, each side of about 10 μm, and the pitch p of the plurality of organic EL devices 10R, 10G, and 10B is, for example, about 3.3 μm.

An insulating film 20 is provided in an inter-device region 10A between the plurality of organic EL devices 10R, 10G, and 10B. The insulating film 20 has a groove 30 in a position between adjacent organic EL devices 10R and 10G (or adjacent organic EL devices 10G and 10B, or adjacent organic EL devices 10B and 10R). Thereby, in the display unit, drive current leakage between adjacent organic EL devices 10R and 10G (or adjacent organic EL devices 10G and 10B, or adjacent organic EL devices 10B and 10R) is allowed to be suppressed.

The groove 30 is provided, for example, continuously from the upper end to the lower end of the display region 110 over the plurality of rows of the plurality of organic EL devices 10R, 10G, and 10B in the column direction. Thereby, if an after-mentioned second electrode 15 of the organic EL devices 10R, 10G, and 10B is sectioned in the row direction by the groove 30, the second electrode 15 is allowed to exist as a continuous common electrode in the column direction. For details of the groove 30, a description will be given later.

Figure 4:
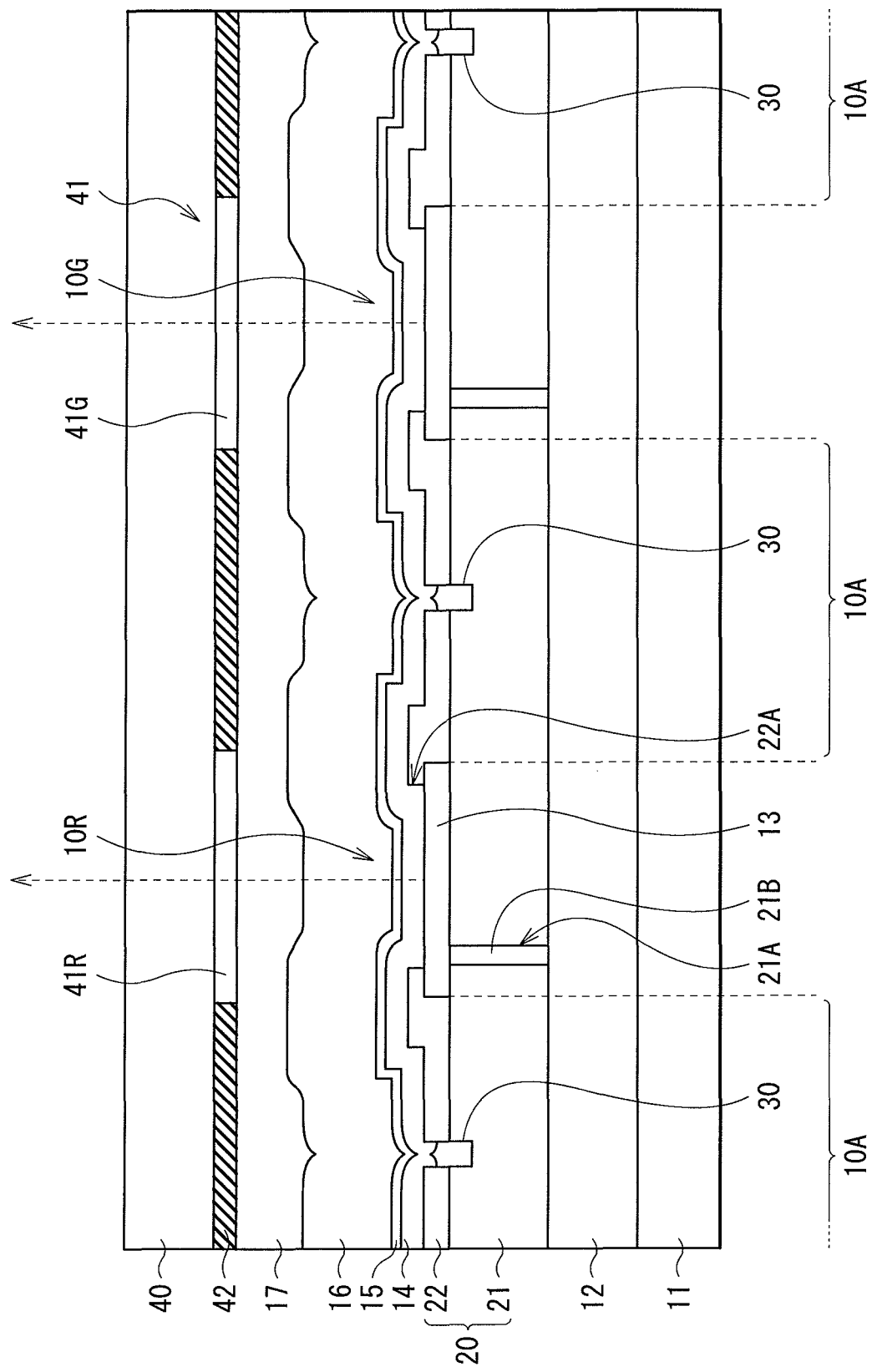
FIG. 4 is a cross-sectional view taken along a line IV-IV of FIG. 3.

FIG. 4 illustrates a cross-sectional configuration taken along a line IV-IV of FIG. 3. On the substrate 11, a drive circuit layer 12 including the foregoing pixel drive circuit 140 and the like are provided. The whole surface on which the drive circuit layer 12 is provided of the substrate 11 is covered with a first insulating film 21. On the first insulating film 21, the foregoing plurality of organic EL devices 10R, 10G, and 10B are provided. In FIG. 4, only the organic EL devices 10R and 10G are illustrated. In the inter-device region 10A between the plurality of organic EL devices 10R, 10G, and 10B, a second insulating film 22 is provided on the first insulating film 21. The first insulating film 21 and the second insulating film 22 compose the insulating film 20 in FIG. 3. The groove 30 penetrates through the second insulating film 22, and is provided in part of the first insulating film 21 in a thickness direction.

The first insulating film 21 is intended to planarize the surface of the substrate 11 on which the pixel circuit layer 12 is formed. The first insulating film 21 has a thickness of, for example, from 100 nm to 1000 nm both inclusive, and is made of silicon oxide nitride (SiON) or silicon oxide ($SiO_2$ or SiO). In the case where component material of the first insulating film 21 is a silicon-based material such as SiON, $SiO_2$, and SiO, the groove 30 that is deep in the thickness direction of the first insulating film 21 is allowed to be formed easily by etching. The first insulating film 21 is provided with a contact hole 21A for connecting to the drive transistor Tr1 of the pixel drive circuit 140 of the drive circuit layer 12. The contact hole 21A is provided with a plug 21B made of conductive metal.

The second insulating film 22 is intended to secure insulation between the first electrode 13 and the second electrode 15, and to obtain a desired shape of the light emitting region accurately. The second insulating film 22 covers not only the inter-device region 10A but also the top face end of the first electrode 13, and has an aperture 22A corresponding to the light emitting region of the first electrode 13. The second insulating film 22 has a thickness of, for example, from 100 nm to 200 nm both inclusive, and is made of SiON. In the case where the component material of the second insulating film 22 is a silicon-based material such as SiON, the groove 30 that is deep in the thickness direction of the second insulating film 22 is allowed to be formed easily by etching.

The organic EL devices 10R, 10G, and 10B are provided on the first insulating film 21. In the organic EL devices 10R, 10G, and 10B, the first electrode 13, an organic layer 14 including a light emitting layer, and the second electrode 15 are layered in this order of closeness to the substrate 11. In FIG. 4, though only the organic EL devices 10R and 10G are illustrated, the organic EL device 10B has the same configuration.

The organic EL devices 10R, 10G, and 10B are covered with a protective film 16. Further, a sealing substrate 40 made of glass or the like is bonded to the whole surface of the protective film 16 with an adhesive layer 17 in between, and thereby the organic EL devices 10R, 10G, and 10B are sealed.

The first electrode 13 is provided for each of the plurality of organic EL devices 10R, 10G, and 10B. The first electrode 13 has a thickness of, for example, about 100 nm, is made of aluminum (Al) as a high reflective material or an alloy containing aluminum (Al), and extracts light generated in the light emitting layer from the second electrode 15 side (top emission). The thickness of the first electrode 13 is preferably a value with which the light generated in the light emitting layer is not transmitted therethrough and light extraction efficiency is allowed to be retained, for example, in the range from 30 nm to 200 nm both inclusive. Examples of component material of the first electrode 13 include a reflecting electrode made of aluminum (Al), an alloy thereof, and a simple substance or an alloy of metal elements such as gold (Au), platinum (Pt), nickel (Ni), chromium (Cr), copper (Cu), tungsten (W), molybdenum (Mo), titanium (Ti), tantalum (Ta), and silver (Ag).

Further, the first electrode 13 may have a contact layer (not illustrated) being about 20 nm thick that is made of titanium (Ti), tungsten (W), copper (Cu), tantalum (Ta), molybdenum (Mo), or the like as a base of the foregoing reflecting electrode. The contact layer also has a function as a reflective supplementary layer to retain high reflectance even if the thickness of the first electrode 13 is decreased. In the case where the contact layer is provided, it is enough that the thickness of the first electrode 13 is equal to or larger than 15 nm.

Further, the first electrode 13 may have a three-layer laminated structure composed of a titanium layer as the contact layer or the reflective supplementary layer, the foregoing reflecting electrode made of aluminum, an alloy thereof, or the like, and a titanium layer or a tantalum layer. Otherwise, the first electrode 13 may be formed of a composite film composed of the foregoing reflecting electrode and a transparent electrode made of ITO (Indium Tin Oxide), IZO (registered trademark) (indium zinc composite oxide), $SnO_2$, or the like.

Figure 5:
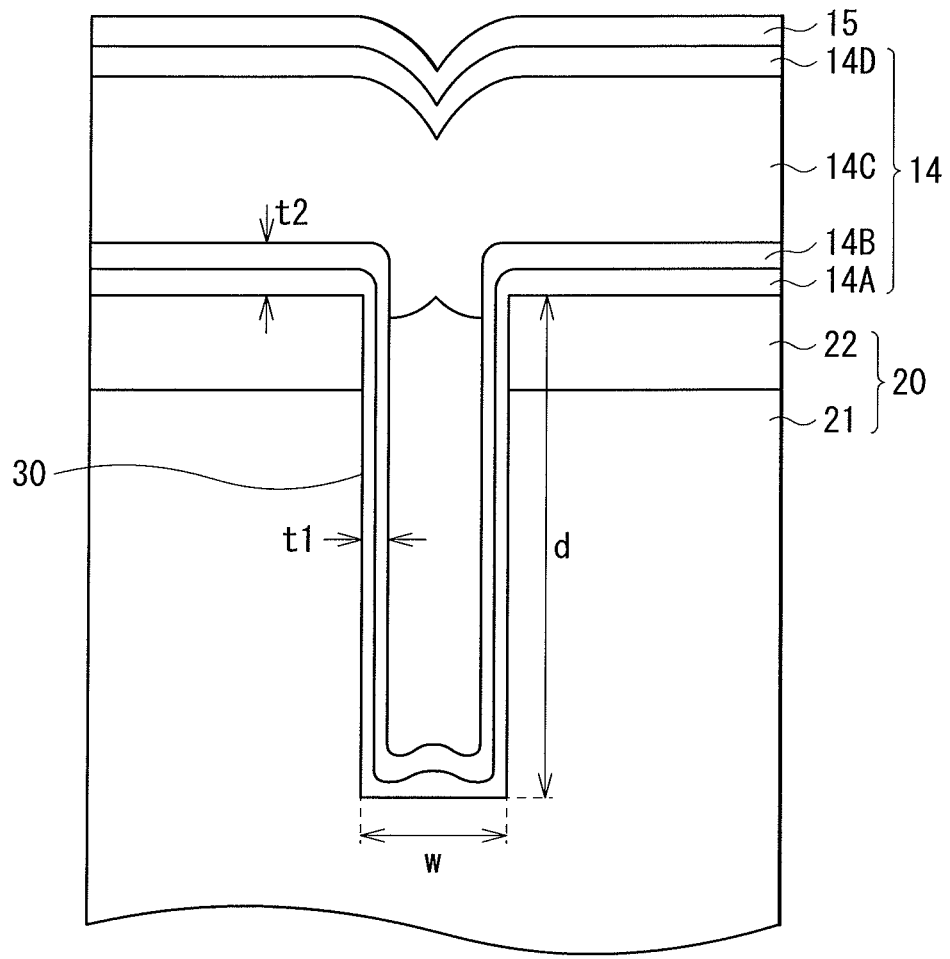
FIG. 5 is a cross-sectional view of an enlarged section in the vicinity of a groove illustrated in FIG. 4.

The organic layer 14 is provided on the first electrode 13 and the second insulating film 22 commonly to the plurality of organic EL devices 10R, 10G, and 10B. The organic layer 14 has, for example, a configuration in which a hole injection layer 14A, a hole transport layer 14B, a light emitting layer 14C, and an electron transport layer 14D are layered in order of closeness to the first electrode 13 as illustrated in FIG. 5.

The hole injection layer 14A is intended to improve hole injection efficiency, and is a buffer layer to prevent leakage. The hole injection layer 14A has a thickness of, for example, from 2 nm to 10 nm both inclusive, and is composed of hexatrilazatriphenylene shown in Chemical formula 1.

[Chemical formula 1]

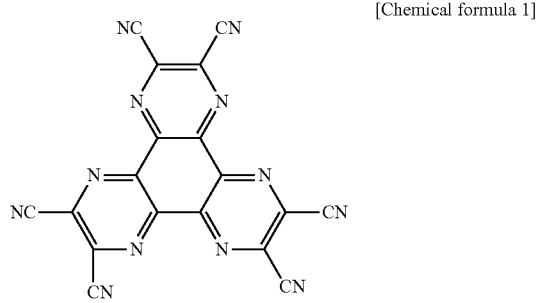 [SMILES: N#Cc1nc2c3nc(C#N)c(C#N)nc3c3nc(C#N)c(C#N)nc3c2nc1C#N]

The hole transport layer 14B is intended to improve hole injection efficiency to the light emitting layer 14C. The hole transport layer 14B has a thickness of, for example, 30 nm, and is composed of a material shown in Chemical formula 2.

[Chemical formula 2]

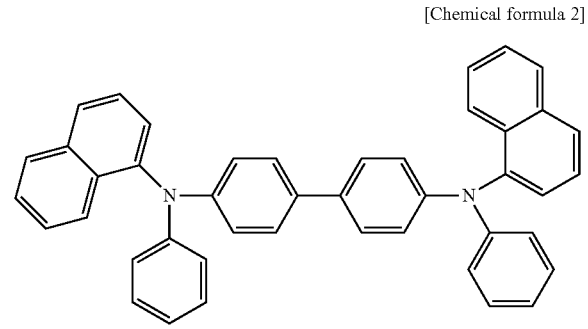 [SMILES: c1ccc(N(c2ccc(-c3ccc(N(c4ccccc4)c4cccc5ccccc45)cc3)cc2)c2cccc3ccccc23)cc1]

The light emitting layer 14C is a white light emitting layer in which a red light emitting layer being 10 nm thick (not illustrated), a light emitting separation layer being 10 nm thick (not illustrated), a blue light emitting layer being 10 nm thick (not illustrated), and a green light emitting layer being 10 nm thick (not illustrated) are layered in order of closeness to the first electrode 13. The red light emitting layer generates red light by recombination of part of holes injected from the first electrode 13 through the hole injection layer 14A and the hole transport layer 14B and part of electrons injected from the second electrode 15 through the electron transport layer 14D by being applied with an electric field. The light emitting separation layer is intended to decrease electron supply amount to the red light emitting layer. The blue light emitting layer generates blue light by recombination of part of holes injected from the first electrode 13 through the hole injection layer 14A, the hole transport layer 14B, and the light emitting separation layer and part of electrons injected from the second electrode 15 through the electron transport layer 14D by being applied with an electric field. The green light emitting layer generates green light by recombination of part of holes injected from the first electrode 13 through the hole injection layer 14A, the hole transport layer 14B, and the light emitting separation layer and part of electrons injected from the second electrode 15 through the electron transport layer 14D by being applied with an electric field. The red light emitting layer, the green light emitting layer, and the blue light emitting layer emit light in a region corresponding to the aperture 22A of the second insulating film 22.

The red light emitting layer contains one or more of a red light emitting material, a hole transport material, an electron transport material, and a both-electric-charge transport material. The red light emitting material may be a fluorescent material or a phosphorescent material. Specifically, the red light emitting layer has a thickness of, for example, about 5 nm, and is composed of a mixture obtained by mixing 30 wt % of 2,6-bis[(4'-methoxydiphenylamino)styryl]-1,5 dicyanonaphthalene (BSN) in 4,4-bis(2,2-diphenylvinyl)biphenyl (DPVBi).

The light emitting separation layer is composed of a material shown in Chemical formula 3, for example.

[Chemical formula 3]

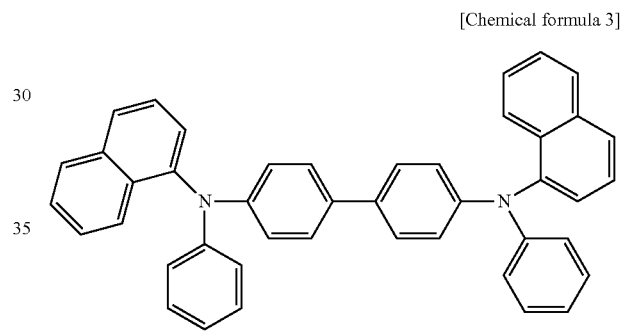

The green light emitting layer contains, for example, one or more of a green light emitting material, a hole transport material, an electron transport material, and a both-electric-charge transport material. The green light emitting material may be a fluorescent material or a phosphorescent material. Specifically, the green light emitting layer has a thickness of, for example, about 10 nm, and is composed of a mixture obtained by mixing 5 wt % of coumarin 6 in DPVBi.

The blue light emitting layer contains, for example, one or more of a blue light emitting material, a hole transport material, an electron transport material, and a both-electric-charge transport material. The blue light emitting material may be a fluorescent material or a phosphorescent material. Specifically, the blue light emitting layer has a thickness of, for example, about 30 nm, and is composed of a mixture obtained by mixing 2.5 wt % of 4,4'-bis [2-{4-(N,N-diphenylamino)phenyl}vinyl]biphenyl (DPAVBi) in DPVBi.

The electron transport layer 14D is intended to improve efficiency to inject electrons into the light emitting layer 14C. The electron transport layer 14D has a thickness of, for example, about 20 nm, and is composed of 8-hydroxyquinolinealuminum (Alq3).

The second electrode 15 illustrated in FIG. 4 is provided on the organic layer 14 commonly to the plurality of organic EL devices 10R, 10G, and 10B. The second electrode has a configuration in which, for example, a first layer composed of lithium fluoride (Lif) being about 0.3 nm thick, a second layer composed of calcium (Ca) being about 3 nm thick, and a third layer composed of Mg—Ag alloy being about 5 nm thick are layered in order of closeness to the first electrode 13. The second electrode 15 is connected to an auxiliary wiring (not illustrated) in a region outside the display region 110 for the following reason. That is, since the organic layer 14 is provided commonly to the plurality of organic EL devices 10R, 10G, and 10B, connection between the second electrode 15 and the auxiliary wiring is not allowed to be made for each of the organic EL devices 10R, 10G, and 10B.

The protective film 16 illustrated in FIG. 4 has a thickness of, for example, from 0.5 μm to 10 μm both inclusive, and is composed of silicon nitride (SiN). The adhesive layer 17 illustrated in FIG. 4 is composed of, for example, an ultraviolet cured resin or a thermoset resin.

The sealing substrate 40 illustrated in FIG. 4 is located on the second electrode 15 side of the organic EL devices 10R, 10G, and 10B, and seals the organic EL devices 10R, 10G, and 10B together with the adhesive layer 17. The sealing substrate 40 is made of, for example, a material such as glass transparent to light generated in the organic EL devices 10R, 10G, and 10B.

The sealing substrate 40 is provided with, for example, a color filter 41 and a light shielding film 42 as a black matrix. The color filter 41 is intended to extract white light generated in the organic EL devices 10R, 10G, and 10B as red, green, or blue light, and has a red filter 41R, a green filter 41G, and a blue filter (not illustrated). The red filter 41R, the green filter 41G, and the blue filter (not illustrated) are sequentially arranged correspondingly to the organic EL devices 10R, 10G, and 10B. The red filter 41R, the green filter 41G, and the blue filter (not illustrated) are respectively made of a resin mixed with a pigment. Adjustment is made by selecting a pigment so that light transmittance in the intended red, green, or blue wavelength region is high, and light transmittance in the other wavelength regions is low.

The light shielding film 42 is intended to absorb outside light reflected by the organic EL devices 10R, 10G, and 10B and wiring therebetween, and to improve contrast. The light shielding film 42 is composed of, for example, a black resin film having an optical density equal to or larger than 1 in which a black colorant is mixed, or a thin film filter by using thin film interference. Of the foregoing, the light shielding film 42 is preferably composed of the black resin film, since thereby the film is allowed to be formed inexpensively and easily. The thin film filter is obtained by layering one or more thin films composed of metal, metal nitride, or metal oxide, and is intended to attenuate light by using thin film interference. Specific examples of the thin film filter include a filter in which chromium and chromium oxide (III)($Cr_2O_3$) are alternately layered.

The groove 30 illustrated in FIG. 3 and FIG. 4 is intended to suppress drive current leakage in the inter-device region 10A as described above. That is, the organic layer 14 is provided as a layer common to the plurality of organic EL devices 10R, 10G, and 10B. Further, the hole injection layer 14A and the hole transport layer 14B illustrated in FIG. 5 have relatively high conductivity out of the organic layer 14. Therefore, the hole injection layer 14A and the hole transport layer 14B easily form a leakage path between the first electrodes 13 of adjacent organic EL devices 10R, 10G, and 10B. Therefore, for example, if the organic EL device 10R emits light, the adjacent organic EL device 10G emits light, and accordingly chromaticity of simple red color is shifted.

Influence of such a leakage current in the inter-device region 10A is more significant as size of the organic EL devices 10R, 10G, and 10B is smaller. For example, discussion will be given of leakage current $I_L$ flowing in square region 10A1 sandwiched between a long side of the organic EL device 10R and a long side of the adjacent organic EL device 10G in FIG. 3. Resistance R in the square region 10A1 is determined by a ratio between distance between the organic EL devices 10R and 10G and length of the long sides of the organic EL devices 10R and 10G (sheet resistance), and is constant without relation to the size of the organic EL devices 10R, 10G, and 10B. Further, JV characteristics (J: current density) of the organic EL devices 10R, 10G, and 10B are constant without relation to the size of the organic EL devices 10R, 10G, and 10B. That is, voltage V necessary for 100 nit light emission on the whole surface is constant without relation to the size of the organic EL devices 10R, 10G, and 10B. Therefore, the leakage current $I_L$ (=V/R) is constant without relation to the size of the organic EL devices 10R, 10G, and 10B. Meanwhile, drive current $I_0$ used for light emission varies one digit or more according to the size of the organic EL devices 10R, 10G, and 10B. Therefore, the ratio of the leakage current $I_L$ with respect to the drive current $I_0$ used for light emission becomes larger as the size of the organic EL devices 10R, 10G, and 10B gets smaller, resulting in larger influence on image quality.

In this case, by providing the groove 30 in the inter-device region 10A, as illustrated in FIG. 5, thickness t1 inside the groove 30 of the hole injection layer 14A and the hole transport layer 14B is allowed to be decreased down to about one tenth of thickness t2 outside the groove 30 thereof. Therefore, it is possible to increase resistance inside the groove 30 of the hole injection layer 14A and the hole transport layer 14B and suppress drive current leakage in the inter-device region 10A. Thereby, the ratio of the leakage current $I_L$ with respect to the drive current $I_0$ used for light emission becomes equal to or smaller than several %, and influence of leakage current on image quality is allowed to be decreased down to almost invisible level.

Width w of the groove 30 is preferably equal to or smaller than the total film thickness of the organic layer 14, and specifically, is preferably from 10 nm to 150 nm both inclusive. Thereby, as illustrated in FIG. 5, the light emitting layer 14C is allowed to be continuous over the groove 30. As a result, the electron transport layer 14D and the second electrode 15 are allowed to be continuous without being sectioned in parts over the groove 30. Therefore, it is allowed to avoid an event that the second electrode 15 is cut by the groove 30, and to provide the groove 30 not only in the column direction but also in the row direction in a lattice pattern.

Figure 6:
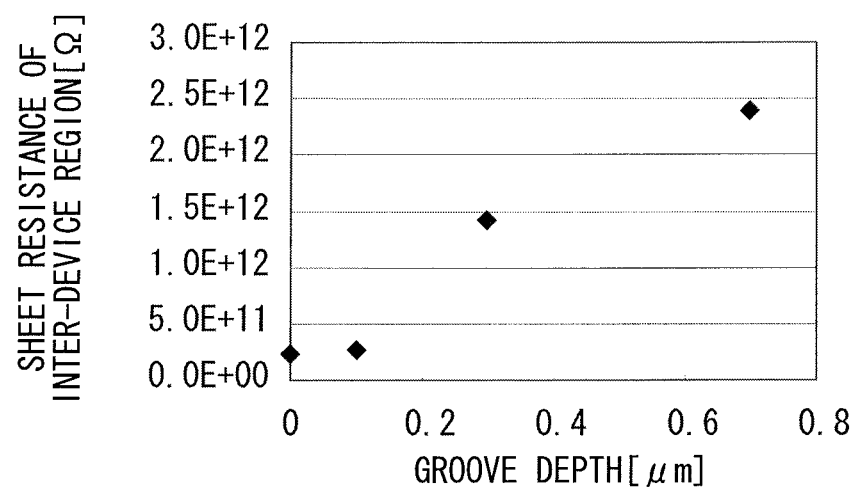
FIG. 6 is a diagram illustrating relation between depth of the groove and sheet resistance of an inter-device region.

FIG. 6 illustrates a result obtained by examining relation between depth d of the groove 30 and sheet resistance in the inter-device region 10A including the groove 30. FIG. 6 illustrates a measurement result of a case in which the pitch p of the plurality of organic EL devices 10R, 10G, and 10B is about 3.3 μm. As can be seen from Table 6, as the depth d of the groove 30 is deeper, a leakage current is allowed to be decreased more. For example, for suppressing light emission of adjacent devices in the case where the pitch p is about 3.3 μm almost entirely, sheet resistance equivalent value of about 2*12 Ω/□ may be necessitated, and the depth d equal to or larger than 500 nm may be necessitated.

A description will be hereinafter given of relation between the pitch of the organic EL devices 10R, 10G, and 10B and a necessary resistance value.

Discussion will be given of two similar figure pixels having different pitches, where respective pitches are p and p'; respective light emitting areas are S and S'; respective drive currents are $I_0$ and $I_0$'; respective leakage currents are $I_L$ and $I_L$'; and respective necessary resistance values are R and R'.

Respective current densities at certain luminance are identical. Therefore, the following expression is established:

$$I'_0 = (S'/S) \, I_0$$
$$= (p'/p)^2 \, I_0$$

Where the ratio of the leakage current $I_L$ to the necessary drive current $I_0$ is r and r', the following expressions are established:

$$I_L = rI_0$$

$$I_L' = r'I_0,$$

where r'=r

Further, respective drive voltages are identical, which is V. Therefore, the following expression is established:

$$R' = V/I'_L$$
$$= (rI_0 R)/(rI'_0)$$
$$= (I_0 R)/((p'/p)^2 \, I_0)$$

Accordingly, the following expression is established:

$$R'/R = (p/p')^2$$

Figure 7A:
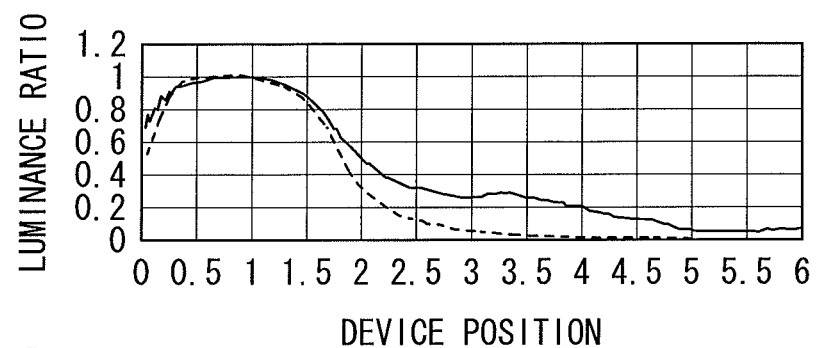
FIGS. 7A to 7C are diagrams illustrating measurement results of luminance of adjacent pixels in the case that the groove is provided by comparison with that in the case that the groove is not provided.
Figure 7B:
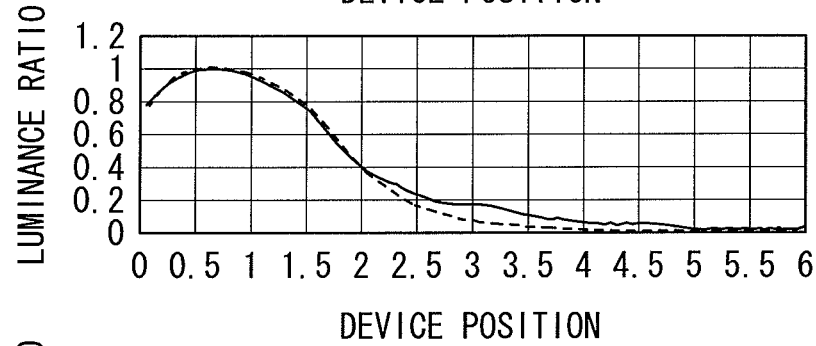
Figure 7C:
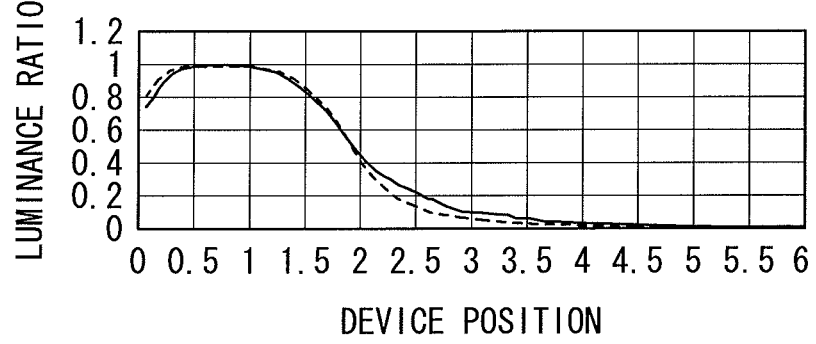
Figure 8A:
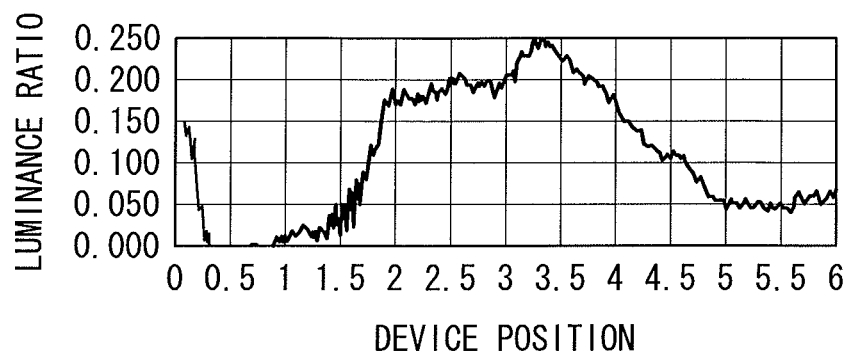
FIGS. 8A to 8C are diagrams illustrating enlarged luminance differences between the cases of the floating devices and the cases that the adjacent devices are grounded illustrated in FIGS. 7A to 7C.
Figure 8B:
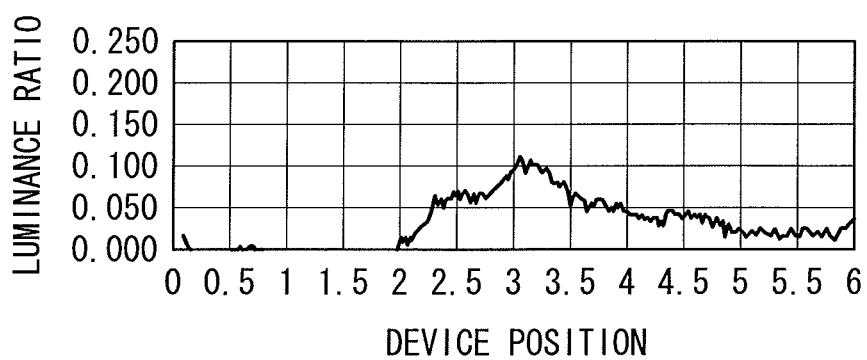
Figure 8C:
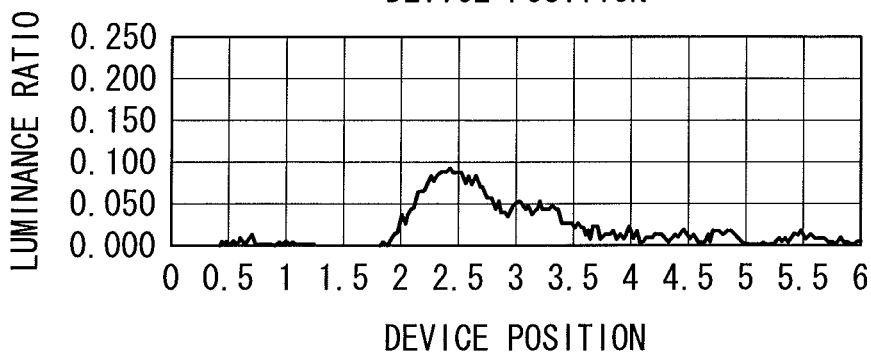

FIGS. 7A to 7C illustrate results obtained by making one device emit light and measuring ratio of luminance of a device adjacent to the foregoing one device with respect to luminance of the foregoing one device. The device practically emitting light is located in the vicinity of from 0.5 to 1 both inclusive of the horizontal axis, and the device adjacent thereto is located in the vicinity of from 3.5 to 4 both inclusive of the horizontal axis. FIG. 7A illustrates a measurement result of Comparative example 1 in which a groove was not provided, FIG. 7B illustrates a measurement result of Example 1-1 in which the depth d of the groove 30 was 300 nm, and FIG. 7C illustrates a measurement result of Example 1-2 in which the depth d of the groove 30 was 700 nm. Further, in FIGS. 7A to 7C, full lines indicate luminance in a case that the adjacent device is a floating device, and dashed lines indicate luminance in a case that the adjacent device is grounded (0 V). Difference between the two values of luminance represents a leakage current. FIGS. 8A to 8C indicate the measurement results by enlarging the foregoing difference.

As can be seen from FIGS. 7A to 7C and FIGS. 8A to 8C, in Examples 1-1 and 1-2 in which the groove 30 was provided, the luminance ratios of the adjacent device were lower than that of Comparative example 1 in which a groove was not provided. That is, it is found that, in the case where the groove 30 is provided in the inter-pixel region 10A, drive current leakage between adjacent organic EL devices 10R, 10G, and 10B is allowed to be suppressed.

Further, comparing Example 1-1 to Example 1-2, as the depth d of the groove 30 was deeper, the luminance ratio of the adjacent device was lower for the following possible reason. That is, the thickness t1 inside the groove 30 of the hole injection layer 14A and the hole transport layer 14B is extremely thin, and resistance of the section with such a thin thickness t1 is increased. Therefore, as the depth d of the groove 30 is deeper, resistance of the entire inter-device region 10A is increased. That is, it is found that, as the depth d of the groove 30 is deeper, drive current leakage between the adjacent organic EL devices 10R, 10G, and 10B is allowed to be suppressed.

The display unit is allowed to be manufactured, for example, as follows.

Figure 9:
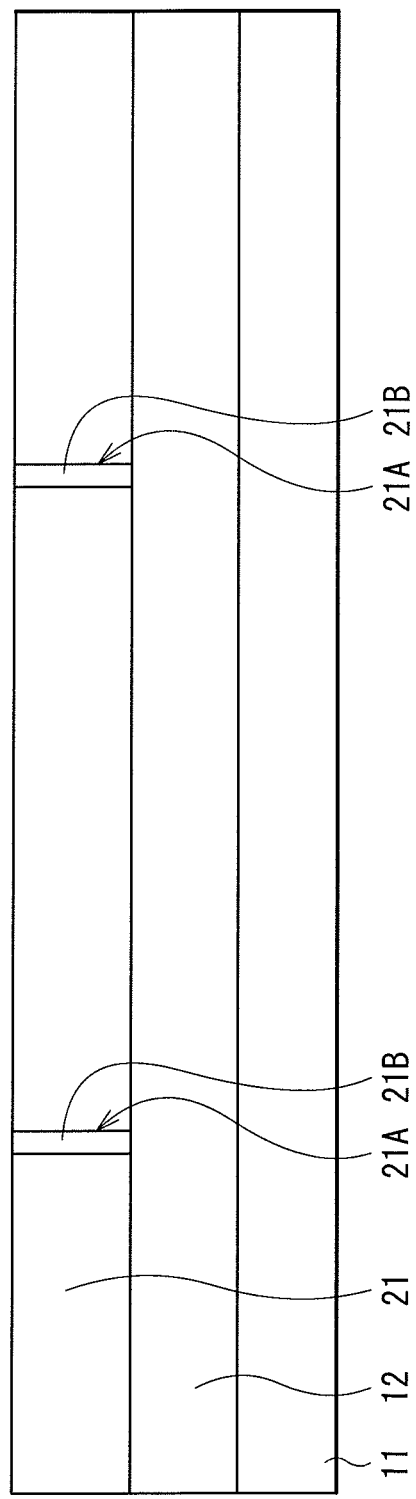
FIG. 9 is a cross-sectional view illustrating a method of manufacturing the display unit illustrated in FIG. 1 in order of steps.

FIG. 9 to FIG. 15 illustrate a method of manufacturing the display unit in order of steps. First, as illustrated in FIG. 9, the drive circuit layer 12 including the pixel drive circuit 140 is formed on the substrate 11 made of the foregoing material. Next, for example, an SiON film, an $SiO_2$ film, or an SiO film having, for example, a thickness from 100 nm to 1000 nm both inclusive is formed by, for example, a plasma CVD (Plasma-Enhanced Chemical Vapor Deposition) method. Subsequently, the SiON film, the $SiO_2$ film, or the SiO film is formed in a determined shape by, for example, a photolithography method and a dry etching method. Again, as illustrated in FIG. 9, the first insulating film 21 having the contact hole 21A is formed. After that, again, as illustrated in FIG. 9, the plug 21B made of conductive metal is buried in the contact hole 21A of the first insulating film 21.

Figure 10:
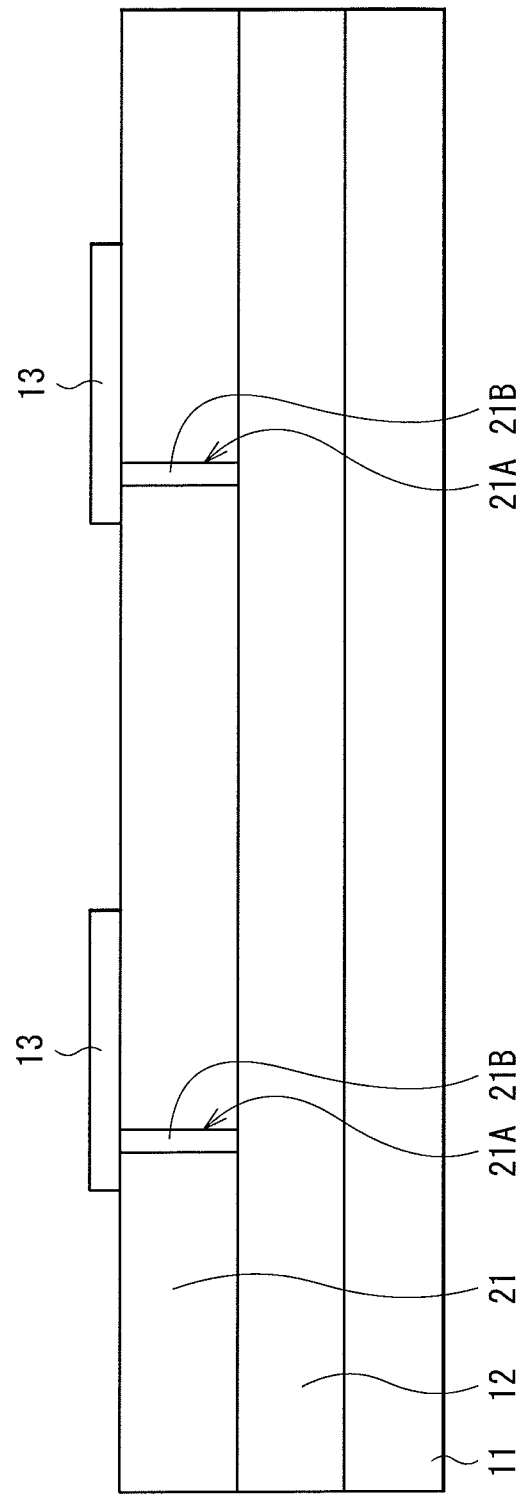
FIG. 10 is a cross-sectional view illustrating a step following a step in FIG. 9.

Subsequently, for example, a titanium film and an aluminum alloy film (not illustrated) are formed on the first insulating film 21 by, for example, a sputtering method. After that, the titanium film and the aluminum alloy film are formed in a determined shape by, for example, a photolithography method and a dry etching method to form the first electrode 13 for each of the plurality of organic EL devices 10R, 10G, and 10B as illustrated in FIG. 10.

Figure 11:
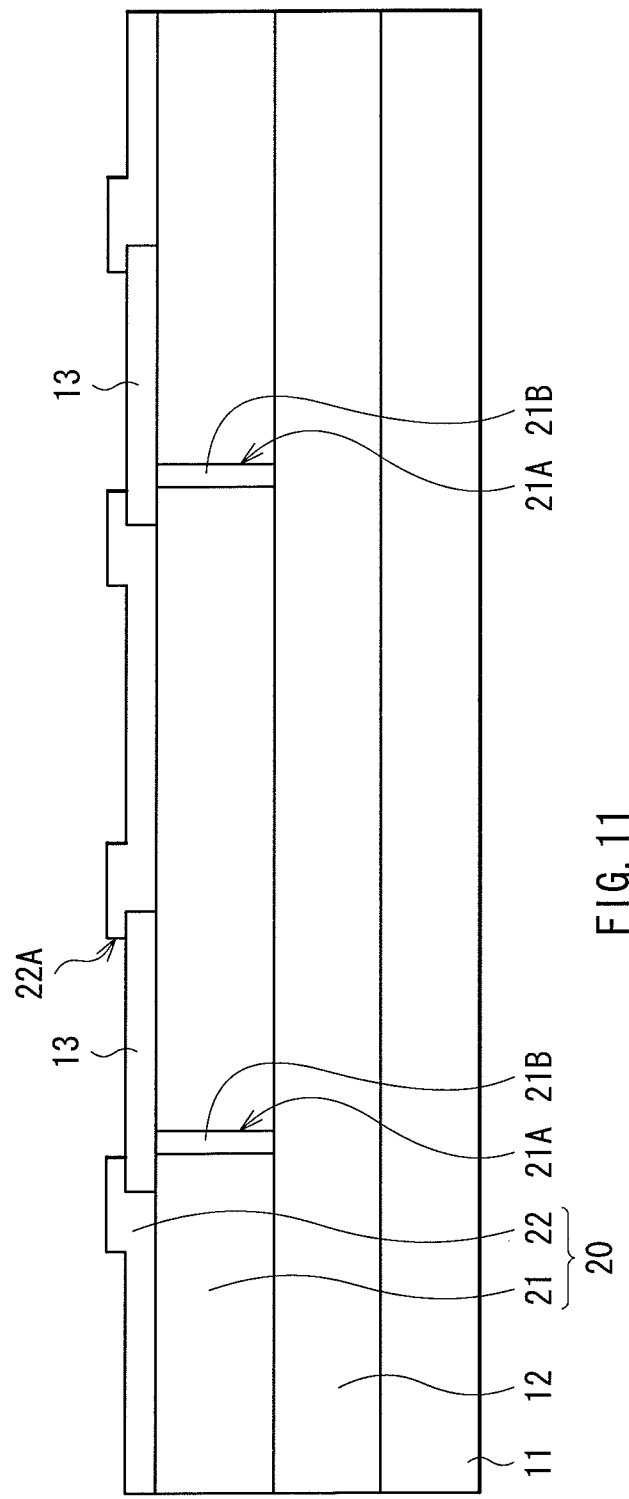
FIG. 11 is a cross-sectional view illustrating a step following the step in FIG. 10.

After the first electrode 13 is formed, an SiON film having, for example, a thickness from 10 nm to 200 nm both inclusive is formed on the first electrode 13 and the first insulating film 21 by a PECVD method. The SiON film is formed in a determined shape by, for example, a photolithography method and a dry etching to form the second insulating film 22 having the aperture 22A as illustrated in FIG. 11.

Figure 12:
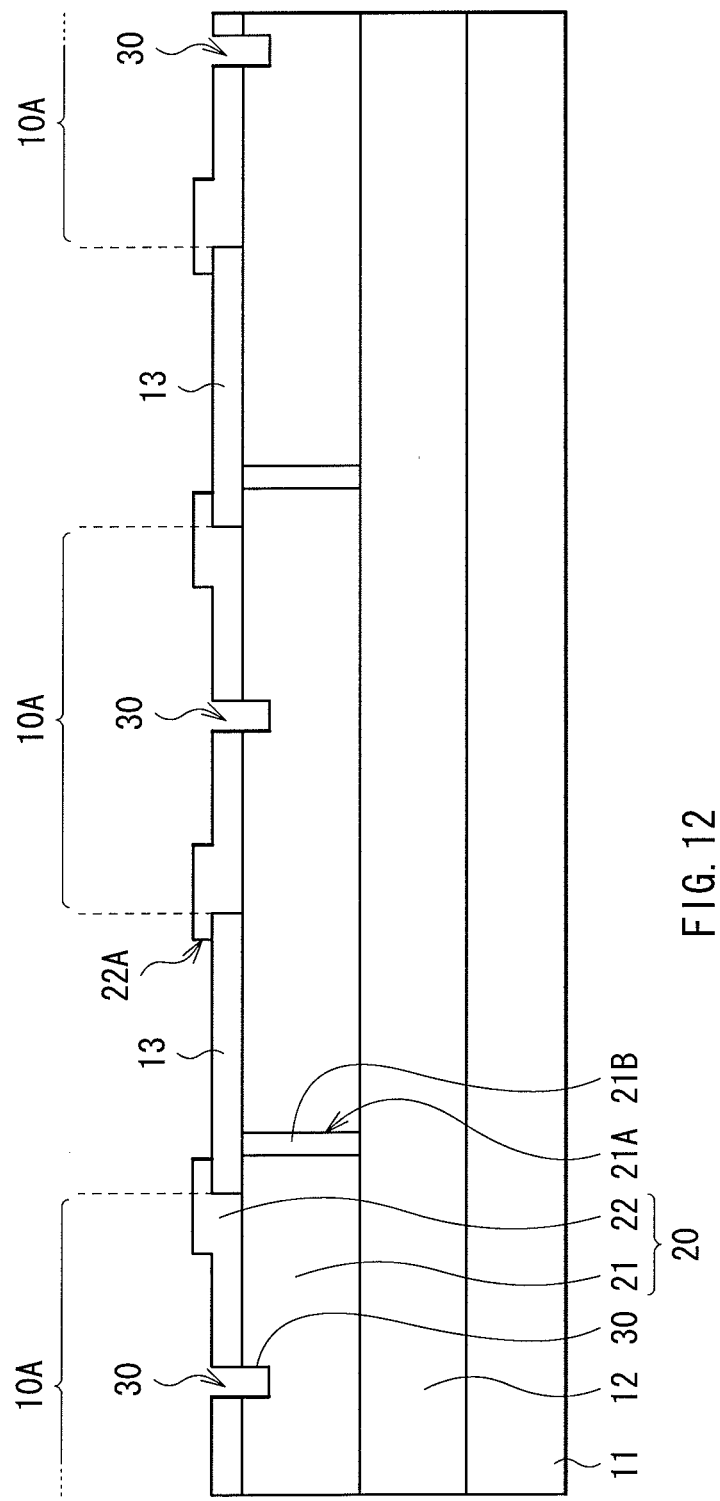
FIG. 12 is a cross-sectional view illustrating a step following the step in FIG. 11.

After the second insulating film 22 is formed, as illustrated in FIG. 12, the groove 30 is provided in the second insulating film 22 and the first insulating film 21 by, for example, a photolithography method and dry etching. In the first insulating film 21, a stopper layer (not illustrated) for etching the groove 30 is allowed to be provided.

Figure 13:
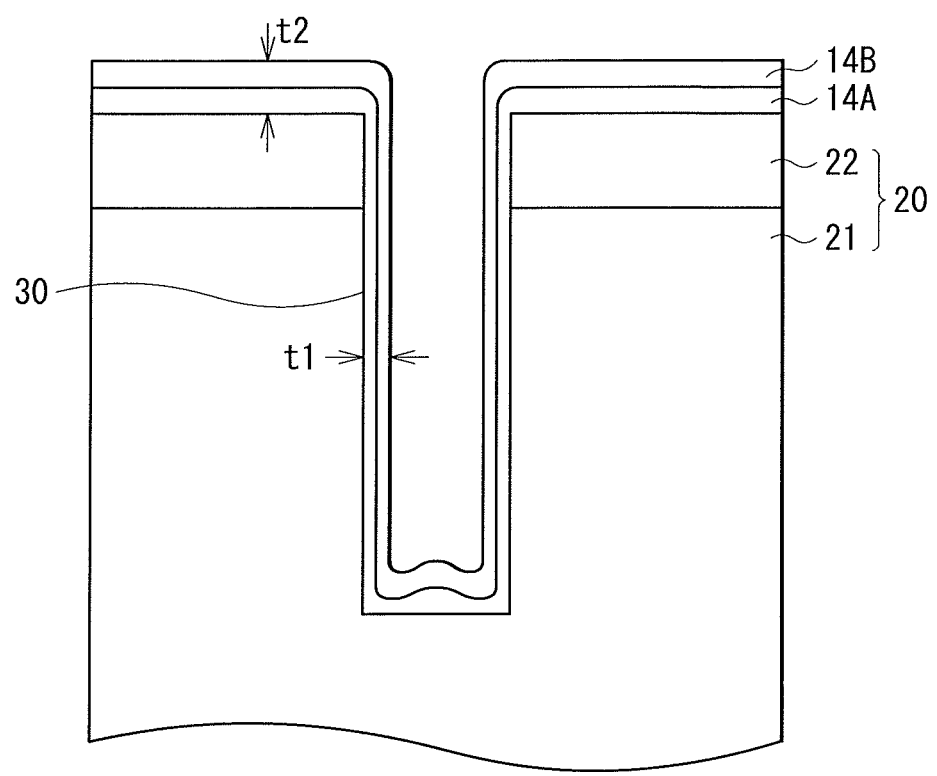
FIG. 13 is a cross-sectional view illustrating a step following the step in FIG. 12.

After the groove 30 is provided, as illustrated in FIG. 13, the hole injection layer 14A and the hole transport layer 14B of the organic layer 14 are formed on the first electrode 13 and the second insulating film 22 by, for example, an evaporation method. At this time, the thickness t1 inside the groove 30 of the hole injection layer 14A and the hole transport layer 14B is decreased down to about one tenth of the thickness t2 outside the groove 30 thereof. Therefore, resistance inside the groove 30 of the hole injection layer 14A and the hole transport layer 14B is increased, and drive current leakage in the inter-device region 10A is suppressed.

Figure 14:
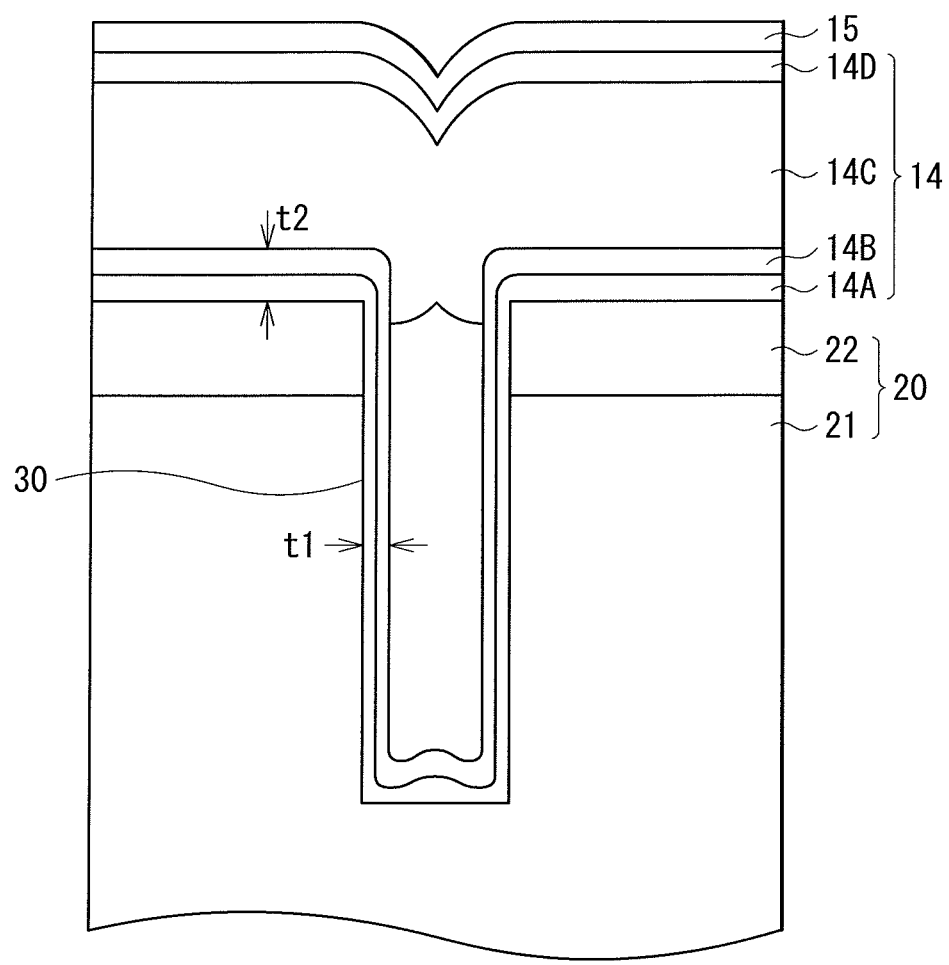
FIG. 14 is a cross-sectional view illustrating a step following the step in FIG. 13.
Figure 15:
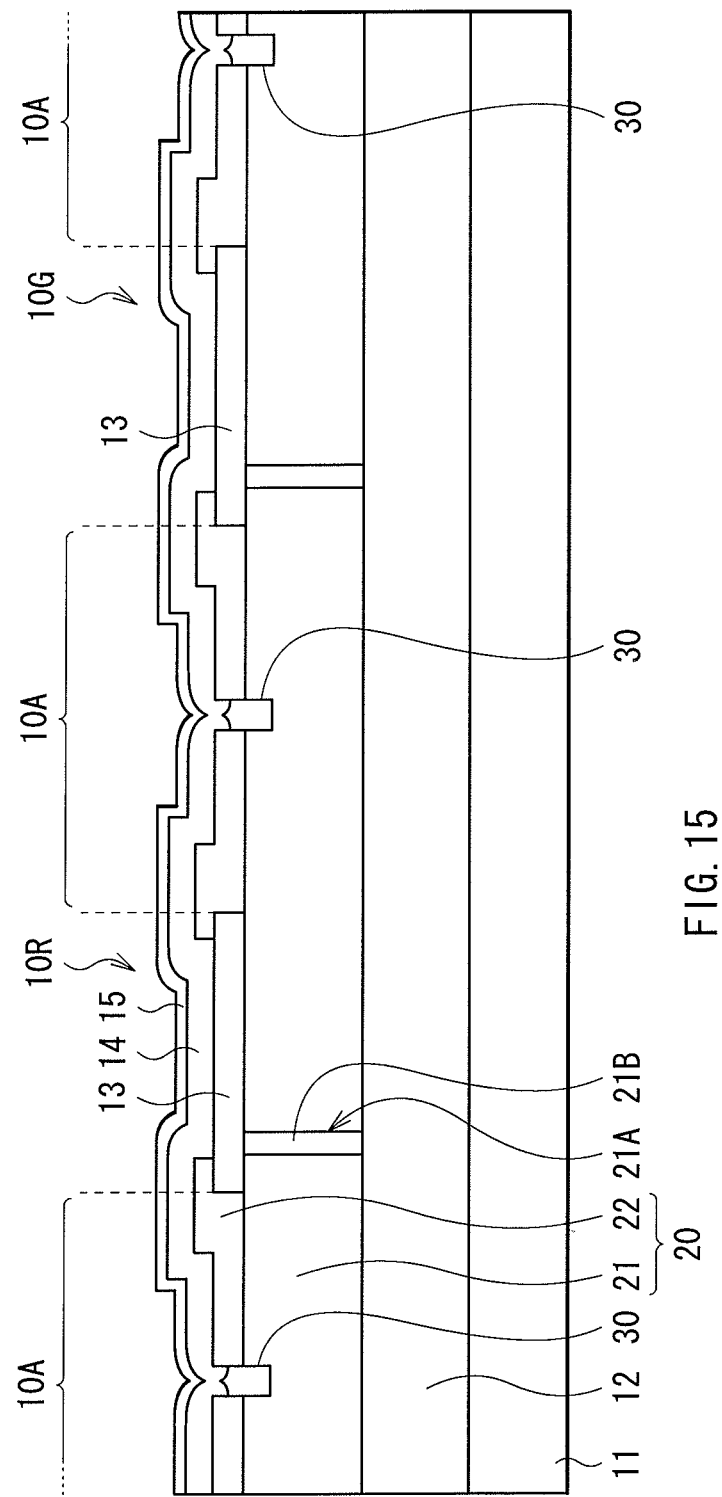
FIG. 15 is a cross-sectional view illustrating a step following the step in FIG. 14.

Subsequently, as illustrated in FIG. 14 and FIG. 15, the light emitting layer 14C and the electron transport layer 14D of the organic layer 14 are formed by, for example, an evaporation method. Subsequently, the second electrode 15 is formed by, for example, a vacuum evaporation method. At this time, since the width w of the groove 30 is, for example, equal to or smaller than the total film thickness of the organic layer 14, specifically, is from 10 nm to 150 nm both inclusive, the light emitting layer 14C is allowed to be continuous over the groove 30. As a result, the electron transport layer 14D and the second electrode 15 are allowed to be continuous without being sectioned over the groove 30, and it becomes possible to avoid a state that the second electrode 15 is sectioned in parts by the groove 30. Accordingly, the organic EL devices 10R, 10G, and 10B illustrated in FIG. 3 and FIG. 4 are formed.

Subsequently, as illustrated in FIG. 4, the protective film 16 made of the foregoing material is formed on the organic EL devices 10R, 10G, and 10B by, for example, a CVD method or a sputtering method.

Further, as illustrated in FIG. 4 again, for example, the light shielding film 42 made of the foregoing material is formed on the sealing substrate 40 made of the foregoing material. Subsequently, the sealing substrate 40 is coated with a material of the red filter 41R by spin coating or the like. The resultant is patterned by photolithography technology, burned, and thereby the red filter 41R is formed. Subsequently, the blue filter (not illustrated) and the green filter 41G are sequentially formed in the same manner as in the red filter 41R.

After that, as illustrated in FIG. 4 again, the adhesive layer 17 is formed on the protective film 16, and the sealing substrate 40 is bonded with the protective layer 16 with the adhesive layer 17 in between. Accordingly, the display unit illustrated in FIG. 1 to FIG. 4 is completed.

In the display unit, the scanning signal is supplied to each pixel through the gate electrode of the writing transistor Tr2 from the scanning line drive circuit 130, and the image signal from the signal line drive circuit 120 is retained in the retentive capacitance Cs through the writing transistor Tr2. That is, the drive transistor Tr1 is on/off-controlled according to the signal retained in the retentive capacitance Cs, and thereby drive current Ids is injected into the respective organic EL devices 10R, 10G, and 10B, electron-hole recombination is generated, and thereby light is emitted. The light is transmitted through the second electrode 15, the protective film 16, the adhesive layer 17, the color filter 41, and the sealing substrate 40 (top emission), and is extracted.

In this case, the insulating film 20 (the first insulating film 21 and the second insulating film 22) is provided in the inter-device region 10A between the plurality of organic EL devices 10R, 10G, and 10B. The insulating film 20 has the groove 30 in a position between adjacent organic EL devices 10R and 10G (adjacent organic EL devices 10G and 10B, or adjacent organic EL devices 10B and 10R). Therefore, the thickness t1 inside the groove 30 of a layer having higher conductivity out of the organic layer 14 such as the hole injection layer 14A and the hole transport layer 14B becomes smaller than the thickness t2 outside the groove 30 thereof, and resistance inside the groove 30 is increased. Therefore, drive current leakage between adjacent organic EL devices 10R, 10G, and 10B is suppressed.

As described above, in the display unit of this embodiment, the insulating film 20 (the first insulating film 21 and the second insulating film 22) is provided in the inter-device region 10A between the plurality of organic EL devices 10R, 10G, and 10B. The groove 30 is provided in a position between adjacent organic EL devices 10R and 10G (or adjacent organic EL devices 10G and 10B, or adjacent organic EL devices 10B and 10R) in the insulating film 20. Therefore, drive current leakage between adjacent organic EL devices 10R, 10G, and 10B is allowed to be suppressed. In addition, differently from the existing display unit, it is not necessary to submit the inverse-tapered-shaped dividing wall to heat treatment to change the shape thereof to forward-tapered shape in the course of an evaporation step, and accordingly characteristics lowering is avoided.

In the foregoing embodiment, the description has been given of the case in which the first insulating film 21 and the second insulating film 22 are layered as the insulating film 20.

However, it is possible that the second insulating film 22 is omitted and only the first insulating film 21 is provided as the insulating film 20.

[Second Embodiment]

Figure 16:
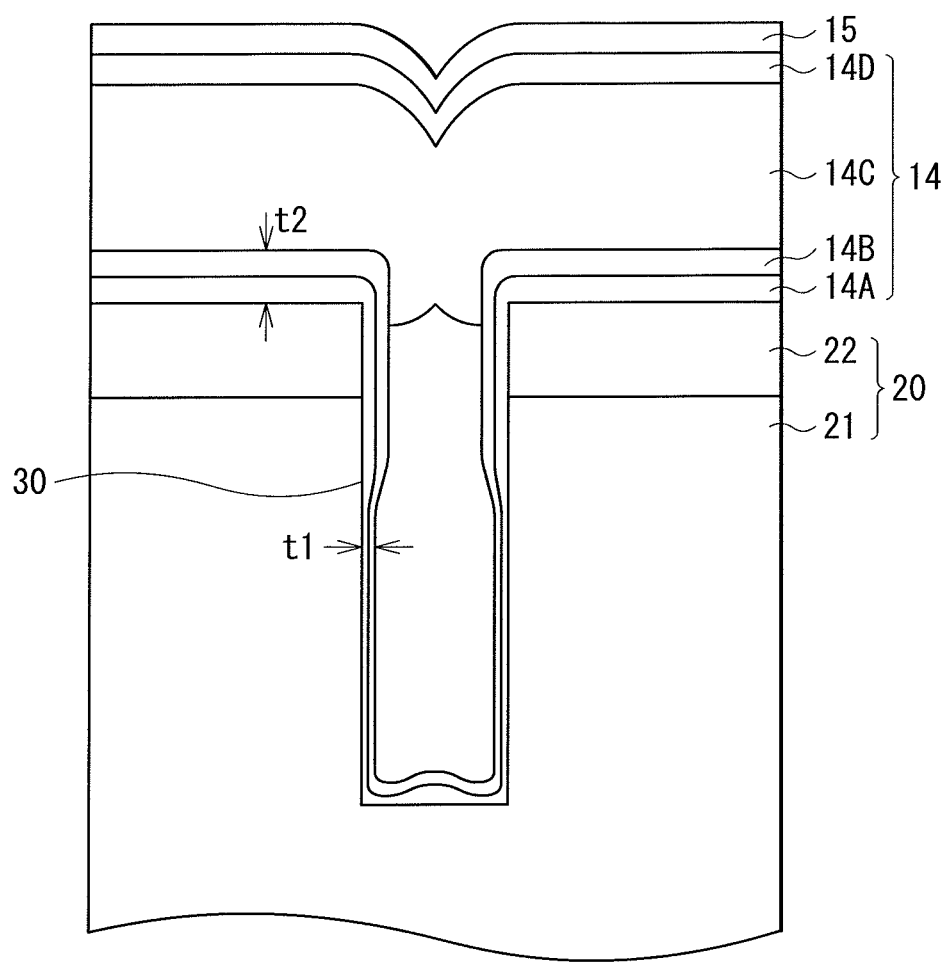
FIG. 16 is a cross-sectional view illustrating an enlarged section in the vicinity of a groove of a display region in a display unit according to a second embodiment of the present disclosure.

FIG. 16 illustrates an enlarged cross-sectional configuration of a section in the vicinity of the groove 30 of the display region 110 in the display unit according to a second embodiment of the present disclosure. In this embodiment, the thickness t1 inside the groove 30 of the hole injection layer 14A and the hole transport layer 14B gets smaller as its position in the groove 30 is deeper. Thereby, in this embodiment, resistance of the hole injection layer 14A and the hole transport layer 14B is allowed to be more increased, and drive current leakage between adjacent organic EL devices 10R, 10G, and 10B is allowed to be more suppressed. Except for such a point, the display unit of this embodiment has the same configuration, the same function, and the same effect as those of the foregoing first embodiment.

The display unit is allowed to be manufactured, for example, as follows. For manufacturing steps similar to those of the first embodiment, a description will be given with reference to FIG. 9 to FIG. 15.

First, as illustrated in FIG. 9, the drive circuit layer 12 including the pixel drive circuit 140, and the first insulating film 21 are formed on the substrate 11 as in the first embodiment.

Next, as illustrated in FIG. 10, the first electrode 13 is formed for each of the plurality of organic EL devices 10R, 10G, and 10B on the first insulating film 21 as in the first embodiment.

Subsequently, as illustrated in FIG. 11, the second insulating film 22 is formed as in the first embodiment.

After that, as illustrated in FIG. 12, the groove 30 is provided in the second insulating film 22 and the first insulating film 21 as in the first embodiment.

After the groove 30 is provided, as illustrated in FIG. 13 to FIG. 15, the hole injection layer 14A, the hole transport layer 14B, the light emitting layer 14C, and the electron transport layer 14D of the organic layer 14 are formed over the first electrode 13 and the second insulating film 22 by, for example, an evaporation method.

Figure 17:
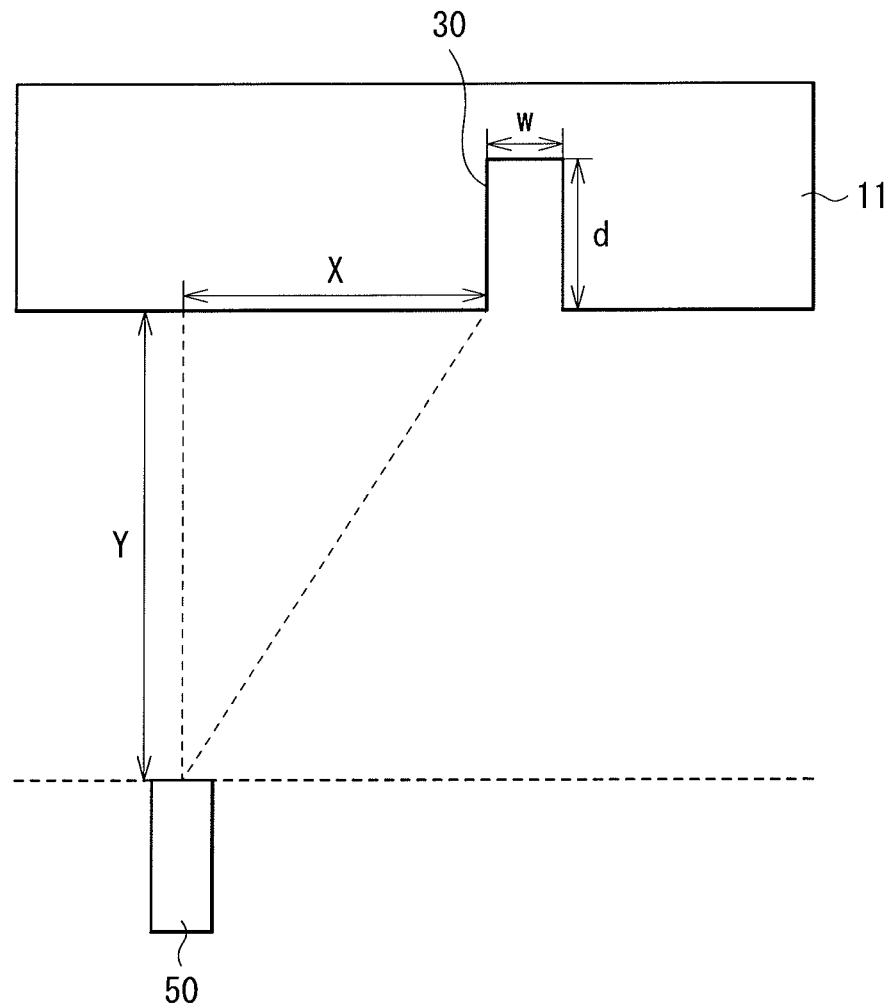
FIG. 17 is a diagram for explaining a method of manufacturing the display unit illustrated in FIG. 16.

In the step of forming the organic layer 14, as illustrated in FIG. 17, position relation between the groove 30 on the substrate 11 and an evaporation source 50 preferably satisfies Mathematical expression 1. Thereby, as illustrated in FIG. 16, it becomes possible that the thickness t1 inside the groove 30 of the hole injection layer 14A and the hole transport layer 14B gets smaller as its position in the groove 30 is deeper. It is to be noted that in this case, the substrate 11 does not mean the substrate 11 itself, but means the surface of the substrate 11 at the time of evaporation, specifically, the surface of the second insulating film 22.

$$X/Y > w/d \qquad \text{[Mathematical expression 1]}$$

In the expression, X represents offset distance from the entrance edge of the groove 30 to the evaporation source 50, Y represents distance between the substrate 11 and the evaporation source 50, w represents width of the groove, and d represents depth of the groove 30.

Mathematical expression 1 expresses $\tan \theta > \tan \alpha$, that is, $\theta > \alpha$ in FIG. 17, where $\theta$ is an angle made by a vertical line drawn from the evaporation source 50 to the substrate 11 and a straight line from the evaporation source 50 to the entrance of the groove 30, and $\alpha$ is an angle made by a wall surface of the groove 30 and a straight line from the entrance of the groove 30 to the bottom surface thereof.

As an evaporation method, for example, a rotary evaporation method or a linear evaporation method may be used. The rotary evaporation method is a method in which the cell type evaporation source 50 is used and film formation is performed while the substrate 11 is rotated above the evaporation source 50. At this time, the evaporation source 50 is arranged so that the position relation between the groove 30 on the substrate 11 and the evaporation source 50 satisfies Mathematical expression 1. Further, as long as Mathematical expression 1 is satisfied during part or all of a time period in which the substrate 11 is rotated once, the foregoing effect of decreasing film thickness of the hole injection layer 14A and the hole transport layer 14B is allowed to be obtained.

In the rotary evaporation method, a material is put in a crucible (not illustrated) of the evaporation source, and the material is evaporated by heating the crucible by a heater. As a material of the crucible, ceramics such as PBN and alumina, Ta, and the like are desirable. Evaporated molecules linearly fly according to directivity of the evaporation source 50 (n value), and are deposited on the substrate 11. In this case, the n value represents ratio (A/A0) of evaporation density A in a given position with respect to evaporation density A0 at the center, and is a value obtained by approximation with cos nθ.

Figure 19:
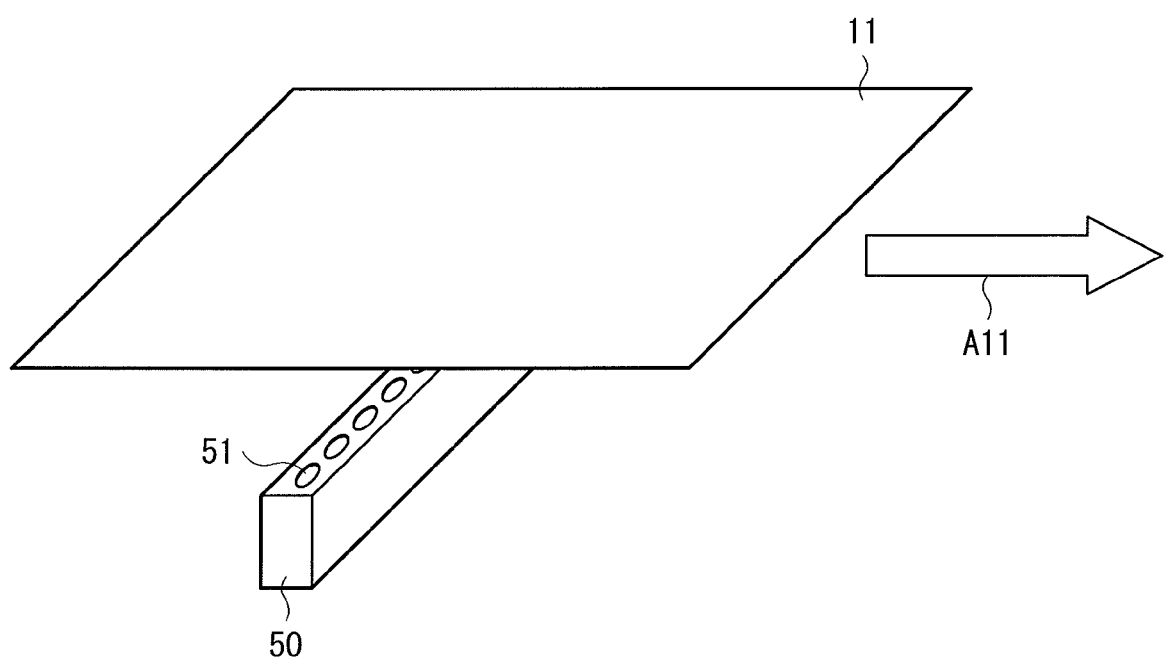
FIG. 19 is a diagram for explaining a linear evaporation method.

For example, as illustrated in FIG. 19 and FIG. 20, the linear evaporation method is a method in which a long evaporation source 50 is used, and film formation is made while the evaporation source 50 and the substrate 11 as an evaporation target are relatively moved in direction of arrow A11. In the line-shaped evaporation source 50, a plurality of apertures 51 are provided along the longitudinal direction, and an evaporation material is ejected from each apertures 51. Film formation width 53 in the carrying direction is determined by a limitation plate 52 provided in the substrate movement direction A11. At this time, the evaporation source 50 is arranged so that the position relation between the groove 30 on the substrate 11 and the evaporation source 50 satisfies Mathematical expression 1. Further, as long as Mathematical expression 1 is satisfied in part or all of a time period in which the substrate 11 passes over the evaporation source 50, the foregoing effect of decreasing film thickness of the hole injection layer 14A and the hole transport layer 14B is allowed to be obtained.

Further, in the step of forming the hole injection layer 14A or the hole transport layer 14B out of the organic layer 14, Mathematical expression 1 is preferably satisfied for the following reason. Out of the organic layer 14, the hole injection layer 14A and the hole transport layer 14B have comparatively high conductivity, and a leakage path is easily formed between the adjacent organic EL devices 10R, 10G, and 10B.

After the organic layer 14 is formed, as illustrated in FIG. 14 and FIG. 15, the second electrode 15 is formed as in the first embodiment. Thereby, the organic EL devices 10R, 10G, and 10B as illustrated in FIG. 3 and FIG. 4 are formed.

Subsequently, as illustrated in FIG. 4, the protective film 16 and the adhesive layer 17 made of the foregoing materials are formed on the organic EL devices 10R, 10G, and 10B as in the first embodiment. The resultant is bonded with the sealing substrate 40 provided with the color filter 41 and the light shielding film 42. Accordingly, the display unit illustrated in FIG. 1 to FIG. 4 is completed.

Figure 18:
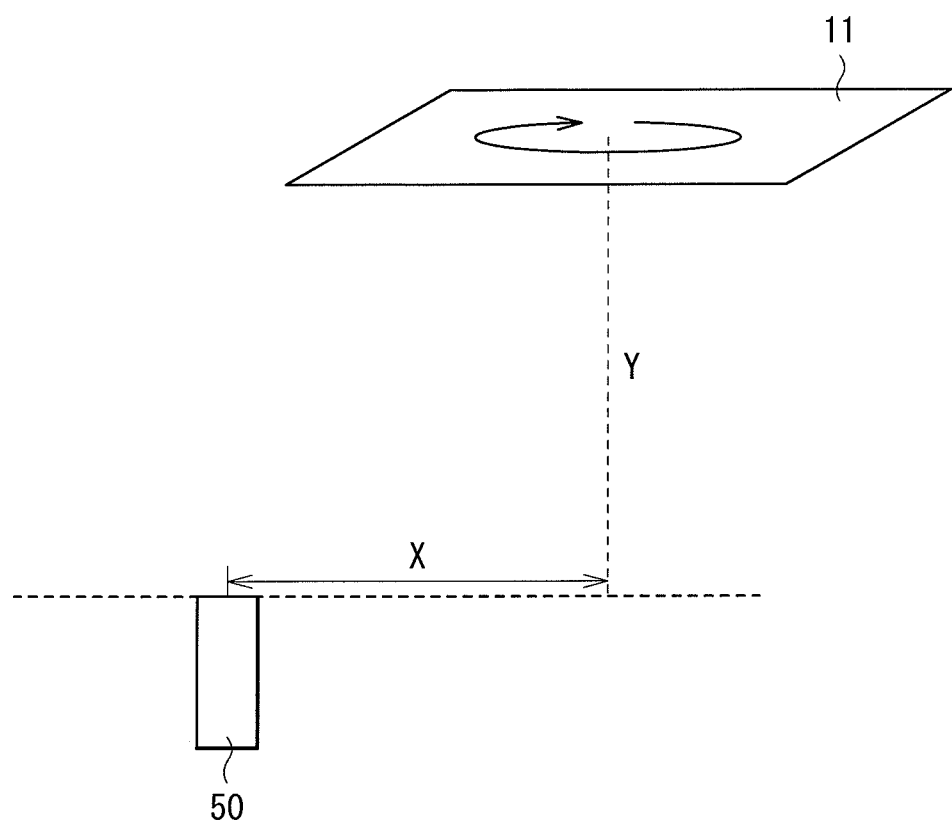
FIG. 18 is a diagram for explaining a rotary evaporation method.
Figure 21:
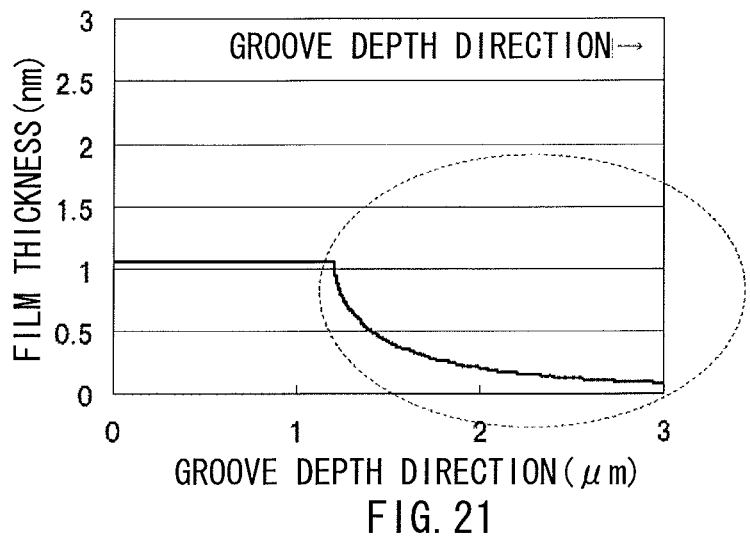
FIG. 21 is a diagram illustrating a first simulation result of thickness inside the groove of a hole injection layer and a hole transport layer.

FIG. 21 is a first simulation result of thickness distribution inside the groove 30 of the hole injection layer 14A and the hole transport layer 14B. As simulation conditions, a rotary evaporation method (see FIG. 18) in which the width w of the groove 30 is 0.4 μm, the depth d is 3.0 μm, the offset distance X from the entrance edge of the groove 30 to the evaporation source 50 is 200 mm, the distance Y between the substrate 11 and the evaporation source 50 is 600 mm, and the directivity n value of the evaporation source 50 is 2 is assumed. The thickness (target thickness) outside the groove 30 of the hole injection layer 14A and the hole transport layer 14B is 10 nm.

As can be seen from FIG. 21, the position relation between the groove 30 on the substrate 11 and the evaporation source 50 satisfies Mathematical expression 1, and the thickness t1 inside the groove 30 of the hole injection layer 14A and the hole transport layer 14B is constant until the depth d1 of the groove 30 reaches 1.2 μm. In the case where the depth d1 of the groove 30 is larger than 1.2 μm (section surrounded by a dashed line in FIG. 21), the thickness t1 inside the groove 30 of the hole injection layer 14A and the hole transport layer 14B becomes smaller as the depth of the groove 30 becomes larger (section surrounded by a dashed line in FIG. 21).

Figure 22:
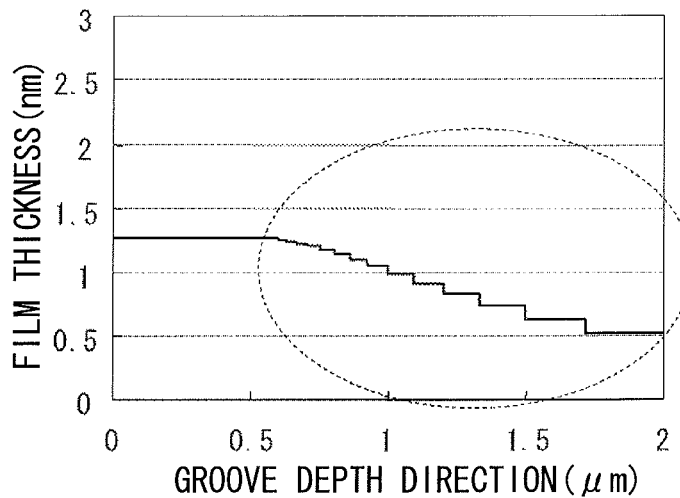
FIG. 22 is a diagram illustrating a second simulation result of the thickness inside the groove of the hole injection layer and the hole transport layer.

FIG. 22 is a second simulation result of thickness distribution inside the groove 30 of the hole injection layer 14A and the hole transport layer 14B. As simulation conditions, oinear evaporation (see FIG. 19 and FIG. 20) in which the width w of the groove 30 is 0.6 μm, the depth d is 2.0 μm, the film formation width 53 in the carrying direction is 200 mm, the distance Y between the substrate 11 and the evaporation source 50 is 100 mm, and the directivity n value of the evaporation source 50 is 10 is assumed. The thickness (target thickness) outside the groove 30 of the hole injection layer 14A and the hole transport layer 14B is 10 nm.

As can be seen from FIG. 22, the position relation between the groove 30 on the substrate 11 and the evaporation source 50 satisfies Mathematical expression 1, and the thickness t1 inside the groove 30 of the hole injection layer 14A and the hole transport layer 14B is constant until the depth d1 of the groove 30 reaches 0.6 μm. In the case where the depth d1 of the groove 30 is larger than 0.6 μm (section surrounded by a dashed line in FIG. 22), the thickness t1 inside the groove 30 of the hole injection layer 14A and the hole transport layer 14B becomes smaller as the depth of the groove 30 becomes larger.

Figure 23:
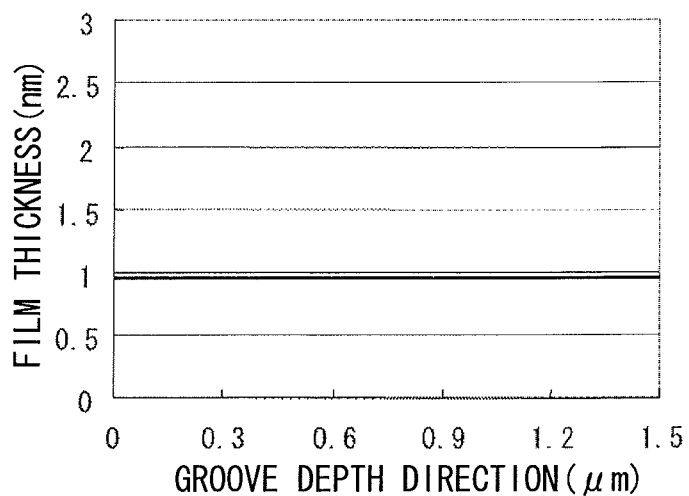
FIG. 23 is a diagram illustrating a third simulation result of the thickness inside the groove of the hole injection layer and the hole transport layer.

FIG. 23 is a third simulation result of thickness distribution inside the groove 30 of the hole injection layer 14A and the hole transport layer 14B. As simulation conditions, rotary evaporation (see FIG. 18) in which the width w of the groove 30 is 0.6 μm, the depth d is 1.5 μm, the offset distance X from the entrance edge of the groove 30 to the evaporation source 50 is 150 mm, the distance Y between the substrate 11 and the evaporation source 50 is 500 mm, and the directivity n value of the evaporation source 50 is 2 is assumed. The thickness (target thickness) outside the groove 30 of the hole injection layer 14A and the hole transport layer 14B is 10 nm.

As can be seen from FIG. 23, the position relation between the groove 30 on the substrate 11 and the evaporation source 50 does not satisfy Mathematical expression 1, and the thickness t1 inside the groove 30 of the hole injection layer 14A and the hole transport layer 14B is constant even after the depth of the groove 30 becomes large. However, the thickness t1 inside the groove 30 of the hole injection layer 14A and the hole transport layer 14B is decreased down to about one tenth of the thickness t2 outside the groove 30 thereof, which means the effect of decreasing film thickness by the groove 30 is obtained.

That is, it is found that, in the case where Mathematical expression 1 is satisfied in the step of forming the organic layer 14, the thickness t1 inside the groove 30 of the hole injection layer 14A and the hole transport layer 14B is allowed to be more decreased, the resistance is allowed to be more increased, and drive current leakage between the adjacent organic EL devices 10R, 10G, and 10B is allowed to be more suppressed.

[Third Embodiment]

Figure 24:
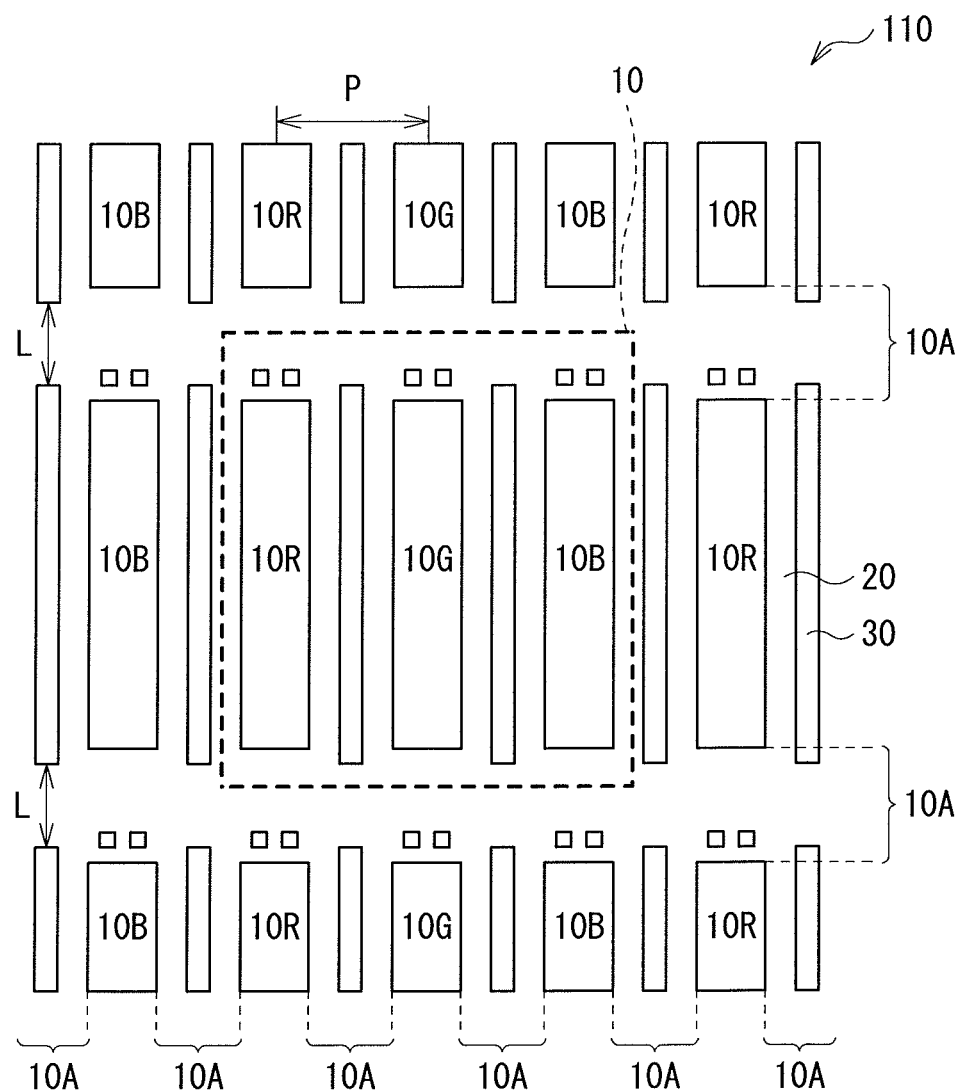
FIG. 24 is a plan view illustrating a configuration of a display region in a display unit according to a third embodiment of the present disclosure.

FIG. 24 illustrates a planar configuration of part of a display region in a display unit according to a third embodiment of the present disclosure. In this embodiment, the groove 30 is provided for each row of the plurality of organic EL devices 10R, 10G, and 10B in the column direction. Thereby, voltage drop of the second electrode 15 is suppressed, and image quality is improved. Except for such a point, the display unit of this embodiment has the same configuration, the same function, and the same effect as those of the foregoing first or second embodiment, and is allowed to be similarly manufactured.

For example, each groove 30 with almost the same length as that of the long side of the organic EL devices 10R, 10G, and 10B is provided in a region between columns of the adjacent organic EL devices 10R, 10G, and 10B. Distance L is provided between the grooves 30 in the column direction.

Figure 25:
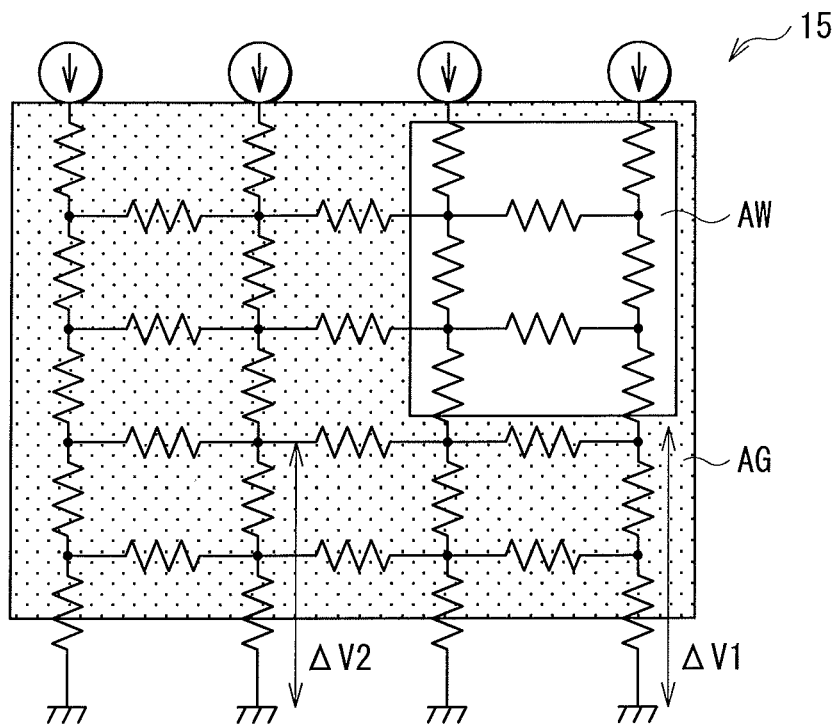
FIG. 25 is a diagram for explaining resistance of a second electrode and a display state in the case where a groove illustrated in FIG. 24 is provided.

FIG. 25 illustrates an equivalent circuit of the second electrode 15 in this embodiment, and illustrates a display state in the case that white is displayed in upper right region AW and gray is displayed in the other region AG, which is lapped over the equivalent circuit. In the equivalent circuit of the second electrode 15 of this embodiment, resistance elements are connected both in the column direction and the row direction in a lattice pattern. Therefore, voltage drop ΔV1 in the white display region AW is approximately equal to voltage drop ΔV2 in the gray display region AG (ΔV1≈ΔV2). Therefore, even gray is displayed.

Figure 26:
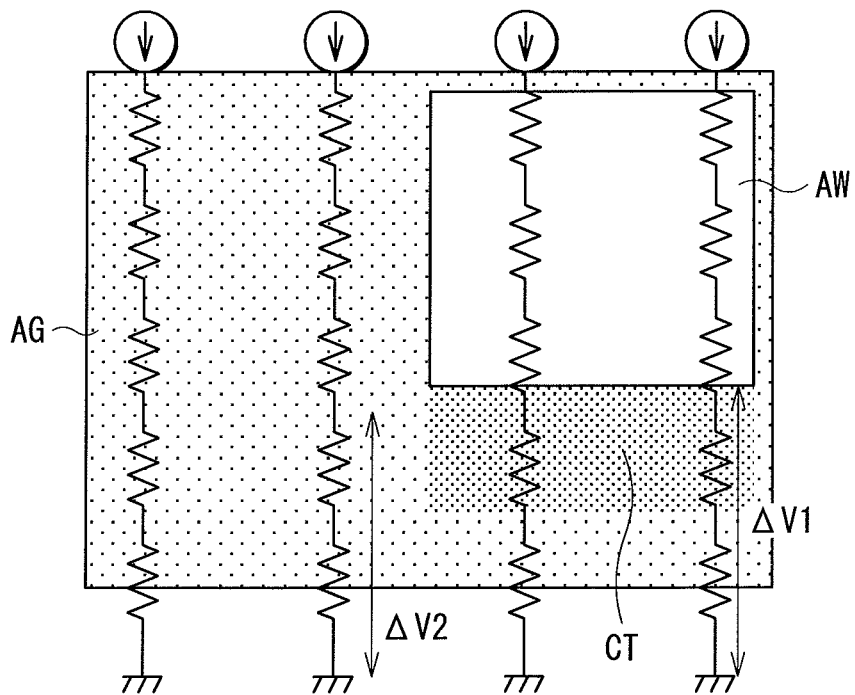
FIG. 26 is a diagram for explaining resistance of the second electrode and a display state in the case where the groove illustrated in FIG. 3 is provided.
Figure 27:
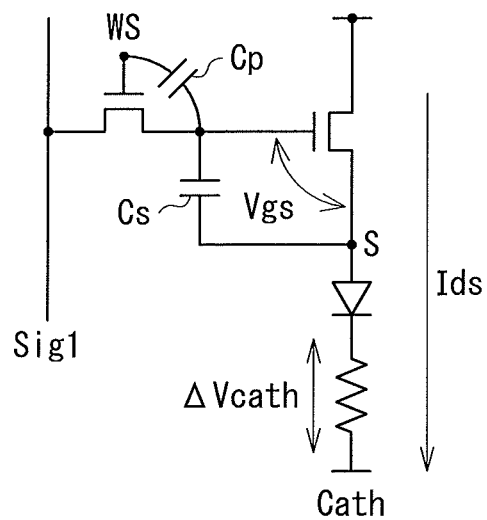
FIG. 27 is a circuit diagram illustrating current Ids flowing in an organic EL device in the pixel drive circuit illustrated in FIG. 2.

Meanwhile, FIG. 26 illustrates an equivalent circuit of the second electrode 15 in the first embodiment, and illustrates a display state in the case that white is displayed in the upper right region AW and gray is displayed in the other region AG, which is lapped over the equivalent circuit. In the equivalent circuit of the second electrode 15 of the first embodiment, resistance elements are connected only in the column direction, and are not connected in the row direction. Therefore, the voltage drop ΔV1 in the white display region AW is larger than the voltage drop ΔV2 in the gray display region AG (ΔV1>ΔV2). Therefore, the drive current Ids flowing in the organic EL devices 10R, 10G, and 10B (see FIG. 27) is decreased above and below the white display region AW, and dark crosstalk CT occurs in the longitudinal direction with respect to the white display region AW. Luminance difference between the crosstalk CT and the normal gray display region AG is about 10%. The current Ids is expressed by Mathematical expression 2.

[Mathematical Expression 2]

$$Ids = \left(Vsig - \frac{C_p}{C_s + C_p} \Delta Vcath\right)^2$$

Figure 28:
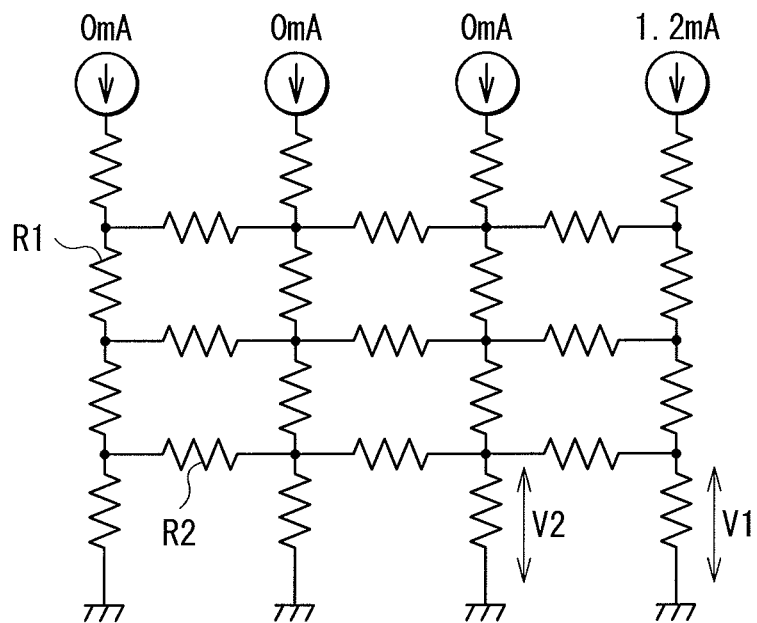
FIG. 28 is a diagram for explaining simulation obtained by examining resistance of the second electrode and a drop voltage by varying distance in a column direction between the respective grooves illustrated in FIG. 24 and thickness of the second electrode.

FIG. 28 and FIG. 29 illustrate a simulation result of resistance R1 in the column direction of the second electrode 15 and resistance R2 in the row direction of the second electrode 15 in the case that the distance L in the column direction between the respective grooves 30 (see FIG. 24) and the thickness of the Mg—Ag alloy layer of the second electrode 15 are changed.

As can be seen from FIG. 29, in this embodiment in which the groove 30 is provided for each row of the plurality of organic EL devices 10R, 10G, and 10B, the resistance R2 in the row direction of the second electrode 15 is remarkably decreased compared to in the first embodiment in which the groove 30 is continuously provided for a plurality of rows of the plurality of organic EL devices 10R, 10G, and 10B. That is, it is found that, in the case where the groove 30 is provided for each row of the plurality of organic EL devices 10R, 10G, and 10B in the column direction, the resistance R2 in the row direction of the second electrode 15 is allowed to be decreased.

Further, comparing the case that the distance L in the column direction between the grooves 30 is 1.0 μm and the case that the distance L in the column direction between the grooves 30 is 2.4 μm, the resistance R2 in the row direction of the second electrode 15 in the case that the distance L is 2.4 μm is higher. That is, it is found that, in the case where the distance L in the column direction between the grooves 30 is wider, the resistance R2 in the row direction of the second electrode 15 is allowed to be decreased.

Figure 30:
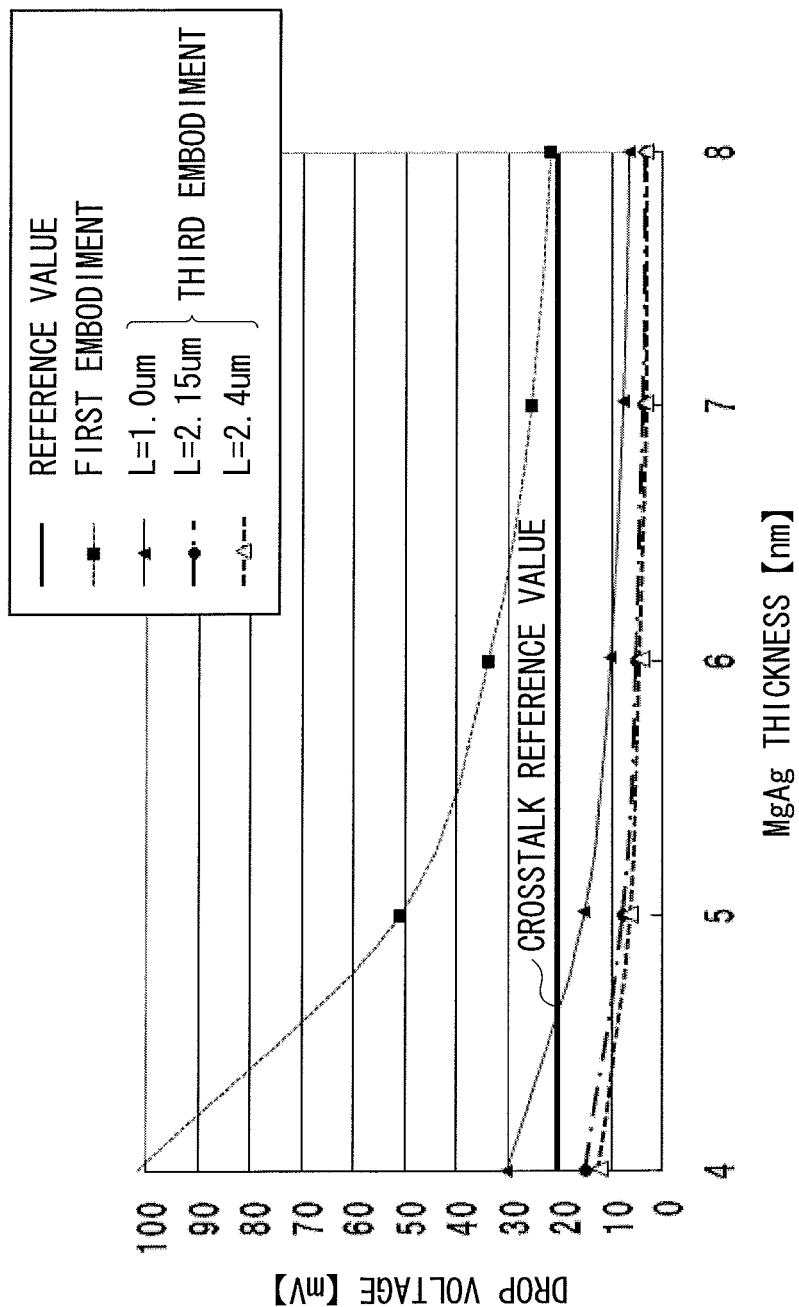
FIG. 30 is a diagram illustrating simulation result of a drop voltage of a second voltage.

FIG. 30 illustrates a simulation result of a drop voltage in the case that the distance L in the column direction between the grooves 30 (see FIG. 24) and the thickness of the Mg—Ag alloy layer of the second electrode 15 are changed as in FIG. 28. As the simulation conditions, it is assumed that a current value of the entire surface of the display region 110 is 15 mA, and only two blocks out of 25 blocks obtained by sectioning the display region 110 are lit. Therefore, flowing current is 15 mA/25*2=1.2 mA. The drop voltage is a difference between a voltage V1 in the column in which the current flows and a voltage V2 in the column in which the current does not flow (V1−V2). Further, in FIG. 30, the reference value at which crosstalk becomes visually tolerable level is 20 mV.

As can be seen from FIG. 30, in this embodiment in which the groove 30 is provided for each row of the plurality of organic EL devices 10R, 10G, and 10B, the drop voltage is remarkably decreased compared to in the first embodiment in which the groove 30 is continuously provided for a plurality of rows of the plurality of organic EL devices 10R, 10G, and 10B. That is, it is found that, in the case where the groove 30 is provided for each row of the plurality of organic EL devices 10R, 10G, and 10B in the column direction, the drop voltage is allowed to be decreased, and deterioration in image quality is allowed to be suppressed.

Further, if comparison is made among the case that the distance L in the column direction between the grooves 30 is 1.0 μm, the case that the distance L in the column direction between the grooves 30 is 2.15 μm, and the case that the distance L in the column direction between the grooves 30 is 2.4 μm, the drop voltage is lower in the case that the distance L is wider. In the case where the distance L in the column direction between the respective grooves 30 is 1.0 μm, the thickness of the Mg—Ag alloy layer of the second electrode 15 may need to be equal to or larger than 4.6 nm in order to obtain crosstalk equal to or smaller than the reference value. Meanwhile, in the case where the distance L in the column direction between the grooves 30 is 2.15 μm and in the case where the distance L in the column direction between the grooves 30 is 2.4 μm, even if the thickness of the Mg—Ag alloy layer of the second electrode 15 is 4.0 nm, crosstalk is equal to or smaller than the reference value. That is, it is found that, in the case where the distance L in the column direction between the grooves 30 is wider, the drop voltage is allowed to be decreased to improve image quality.

[Fourth Embodiment]

Figure 31:
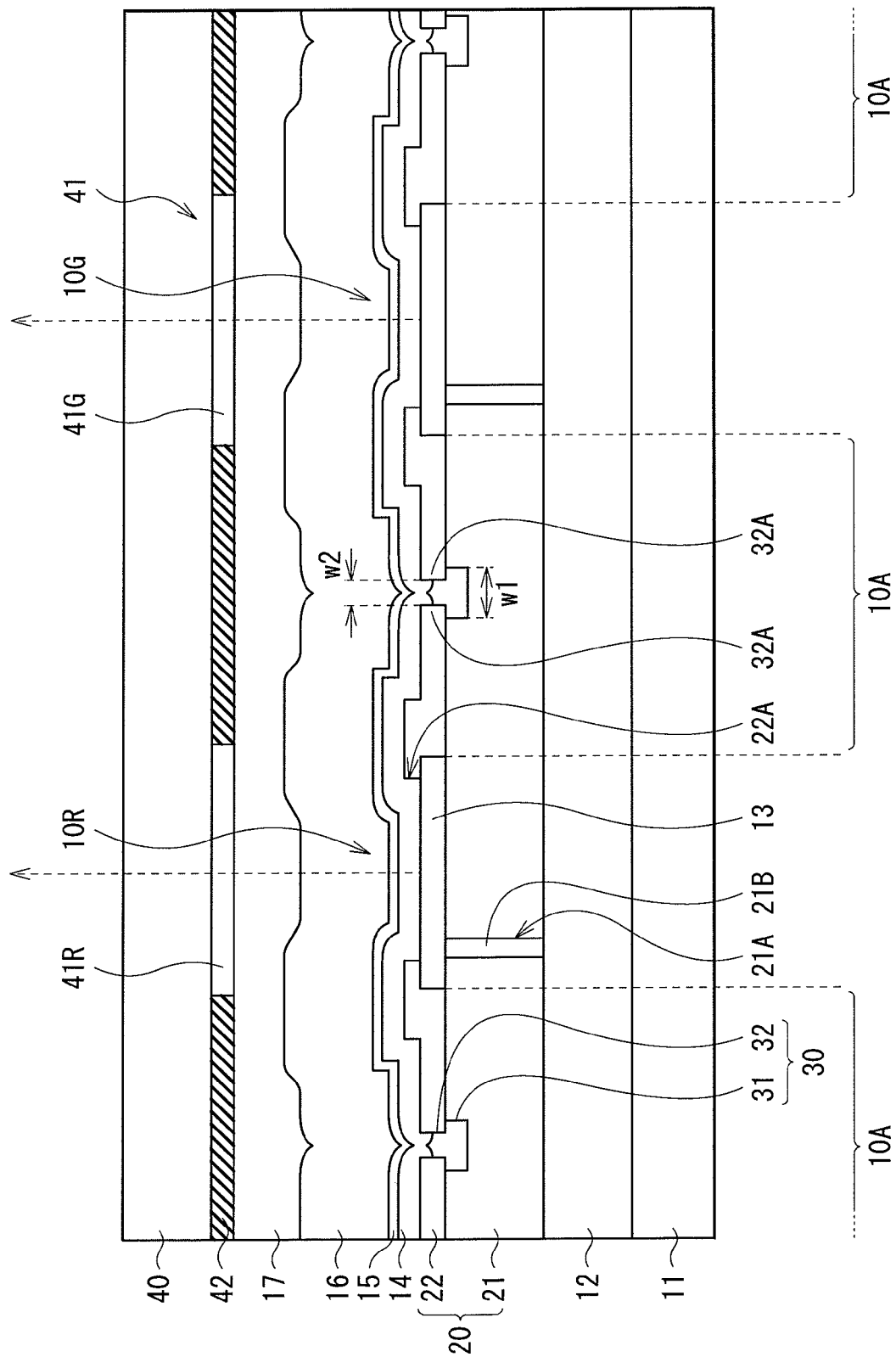
FIG. 31 is a cross-sectional view illustrating a configuration of a display region in a display unit according to a fourth embodiment of the present disclosure.

FIG. 31 illustrates a cross-sectional configuration of part of a display region in a display unit according to a fourth embodiment of the present disclosure. The display unit according to the fourth embodiment has a similar configuration, a similar function, and a similar effect to those of the foregoing first to the third embodiments, except that the groove 30 is composed of, in a two-step manner, a first groove 31 of the first insulating film 21 and a second groove 32 of the second insulating film 22, and is allowed to be manufactured in a similar manner to those of the foregoing first to third embodiments.

The first insulating film 21 has, for example, a thickness from 100 nm to 1000 nm both inclusive, and is composed of silicon oxide nitride (SiON) or silicon oxide ($SiO_2$ or SiO) as in the first embodiment.

In this embodiment, the second insulating film 22 is preferably composed of $SiO_2$ formed at high temperature for the following reason. That is, in the case where the film density of $SiO_2$ is increased, the rate at the time of etching is lower than that of the first insulating film 21, and a canopy section 32A is formed. To be formed at high temperature herein specifically means that a film is formed at about from 400 deg C. to 500 deg C. both inclusive. $SiO_2$ of the first insulating film 21 is formed, for example, at from 250 deg C. to 350 deg C. both inclusive.

Figure 32:
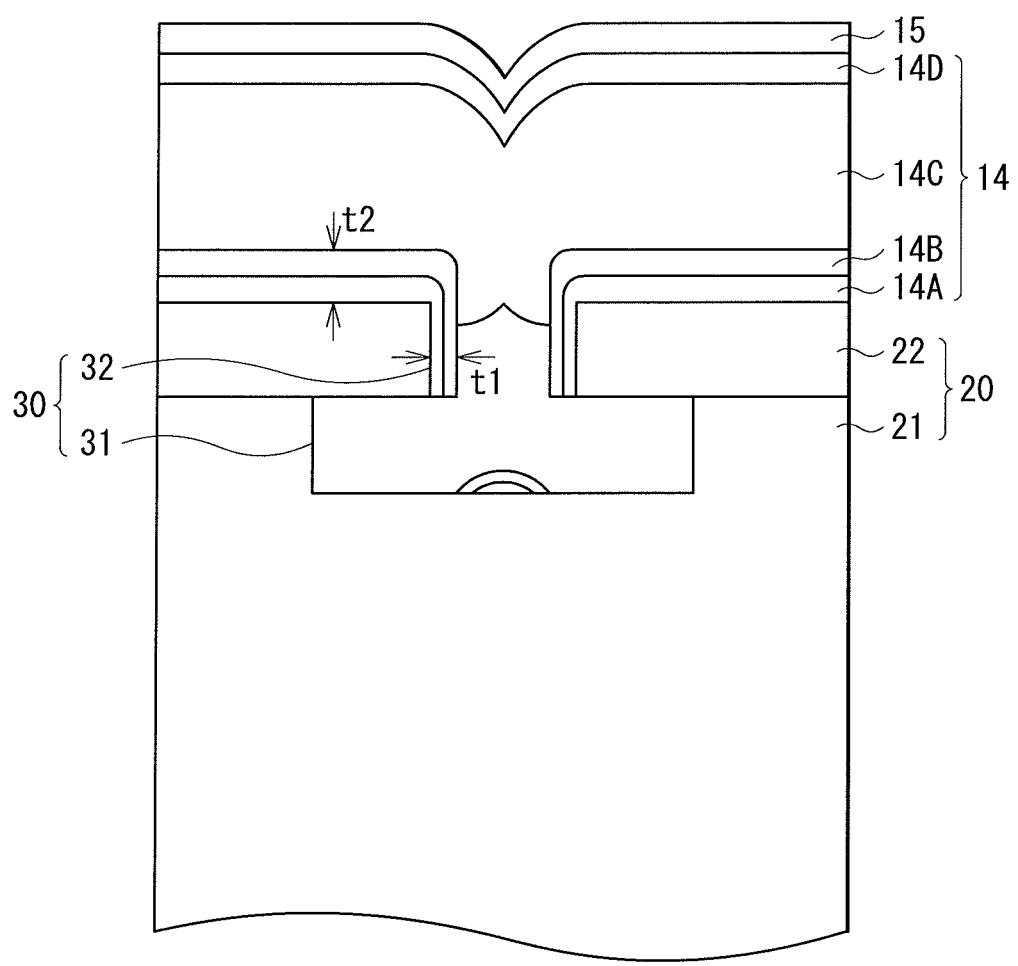
FIG. 32 is a cross-sectional view illustrating an enlarged section in the vicinity of a groove illustrated in FIG. 31.

Width w2 of the second groove 32 is narrower than width w1 of the first groove 31. In other words, the canopy section 32A jetting toward the center of the first groove 31 is provided at the periphery of the second groove 32. Thereby, as illustrated in FIG. 32, though the hole injection layer 14A and the hole transport layer 14B are attached to inside of the second groove 32, the hole injection layer 14A and the hole transport layer 14B are totally cut at the borderline between the second groove 32 and the first groove 31. Therefore, drive current leakage between the adjacent organic EL devices 10R, 10G, and 10B is allowed to be suppressed. Further, in the first embodiment, in order to sufficiently decrease the thickness t1 inside the groove 30 of the hole injection layer 14A and the hole transport layer 14B, the second groove 32 may need to have the depth d of several hundred μm. However, such necessity does not exist in this embodiment.

The width w2 of the groove 32 is preferably, for example, equal to or smaller than the total film thickness of the organic layer 14, and specifically, is preferably from 10 nm to 150 nm both inclusive. Thereby, as illustrated in FIG. 32, the light emitting layer 14C is allowed to be continuous over the second groove 32. As a result, the electron transport layer 14D and the second electrode 15 are allowed to be continuous without being sectioned in parts over the groove 30. Therefore, it is allowed to avoid an event that the second electrode 15 is cut by the groove 30, and to provide the groove 30 not only in the column direction but also in the row direction in a lattice pattern.

The display unit is allowed to be manufactured, for example, as follows. For manufacturing steps similar to those of the first embodiment, a description will be given with reference to FIG. 9 to FIG. 15.

First, as illustrated in FIG. 9, the drive circuit layer 12 including the pixel drive circuit 140 and the first insulating film 21 composed of SiON or $SiO_2$ are formed over the substrate 11 as in the first embodiment.

Next, as illustrated in FIG. 10, the first electrode 13 is formed for each of the plurality of organic EL devices 10R, 10G, and 10B on the first insulating film 21 as in the first embodiment.

Subsequently, as illustrated in FIG. 11, the second insulating film 22 composed of $SiO_2$ formed at high temperature is formed as in the first embodiment.

After that, the second groove 32 penetrating the second insulating film 22 is provided and the first groove 31 is provided in the first insulating film 21 by, for example, a photolithography method and dry etching.

After the second groove 32 is provided, further, wet etching of the first groove 31 and the second groove 32 is performed. As a chemical used for the wet etching, hydrofluoric acid is preferably used. Thereby, the width w1 of the first groove 31 is increased in the first insulating film 21 in which the wet etching rate is high, while the width w2 of the second groove 32 is narrower than the width w1 of the first groove 31, in the second insulating film 22 in which the wet etching rate is low. At the periphery of the second groove 32, the canopy section 32A jetting toward the center of the first groove 31 is formed.

Regarding the planar shape of the groove 30, it is possible that the groove 30 is provided continuously over a plurality of rows of the plurality of organic EL devices 10R, 10G, and 10B as in the first embodiment. Further, it is possible that the groove 30 is provided for each row of the plurality of organic EL devices 10R, 10G, and 10B as in the third embodiment.

After the step-like groove 30 having the first groove 31 and the second groove 32 is provided, as illustrated in FIG. 13 to FIG. 15, as in the first or the second embodiment, the hole injection layer 14A, the hole transport layer 14B, the light emitting layer 14C, and the electron transport layer 14D of the organic layer 14 are formed over the first electrode 13 and the second insulating film 22 by, for example, an evaporation method.

After the organic layer 14 is formed, as illustrated in FIG. 14 and FIG. 15, the second electrode 15 is formed as in the first embodiment. Thereby, the organic EL devices 10R, 10G, and 10B as illustrated in FIG. 3 and FIG. 4 are formed.

Subsequently, as illustrated in FIG. 4, the protective film 16 and the adhesive layer 17 made of the foregoing materials are formed on the organic EL devices 10R, 10G, and 10B as in the first embodiment. The resultant is bonded with the sealing substrate 40 provided with the color filter 41 and the light shielding film 42. Accordingly, the display unit illustrated in FIG. 1 to FIG. 4 is completed.

Figure 33:
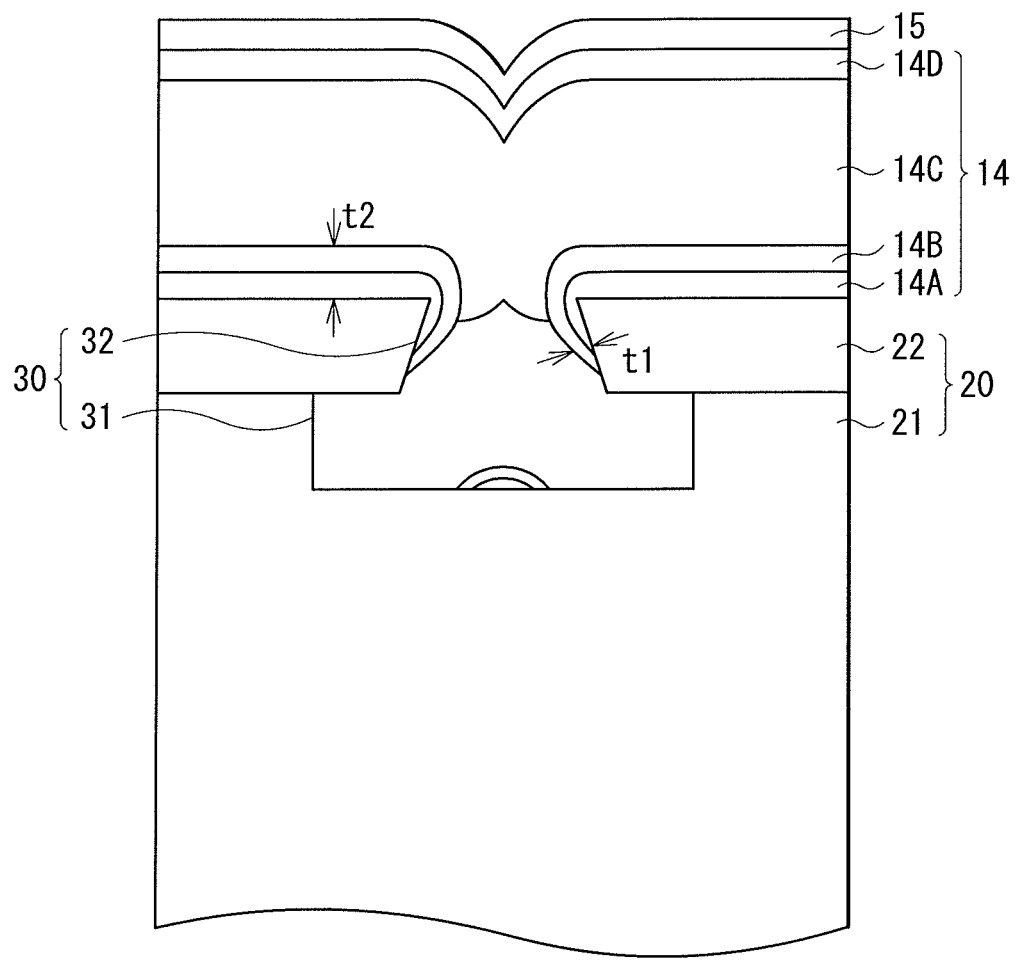
FIG. 33 is a cross-sectional view illustrating another shape of the groove illustrated in FIG. 31.

In the foregoing embodiment, the description has been given of the case that the side surface of the second groove 32 is a vertical surface. However, the side surface of the second groove 32 may be of an inverse-tapered shape as illustrated in FIG. 33 (the width of the second groove 32 becomes wider as the second groove 32 is deeper).

[Fifth Embodiment]

Figure 34:
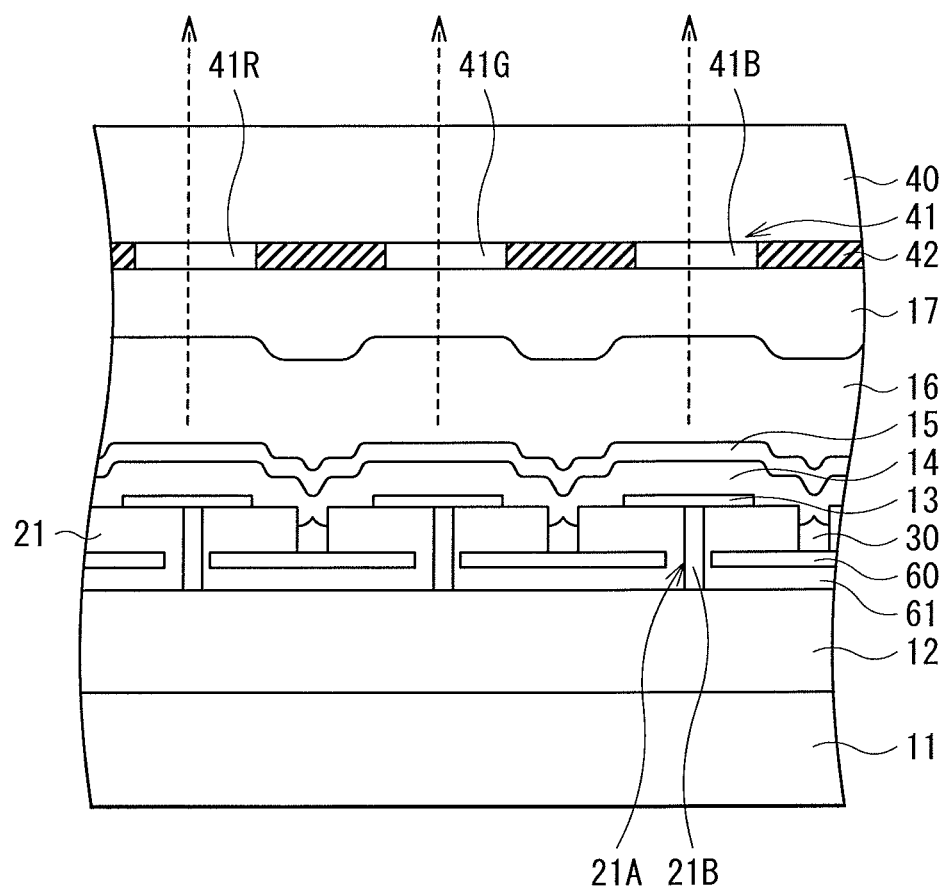
FIG. 34 is a cross-sectional view illustrating a configuration of a display region in a display unit according to a fifth embodiment of the present disclosure.
Figure 35:
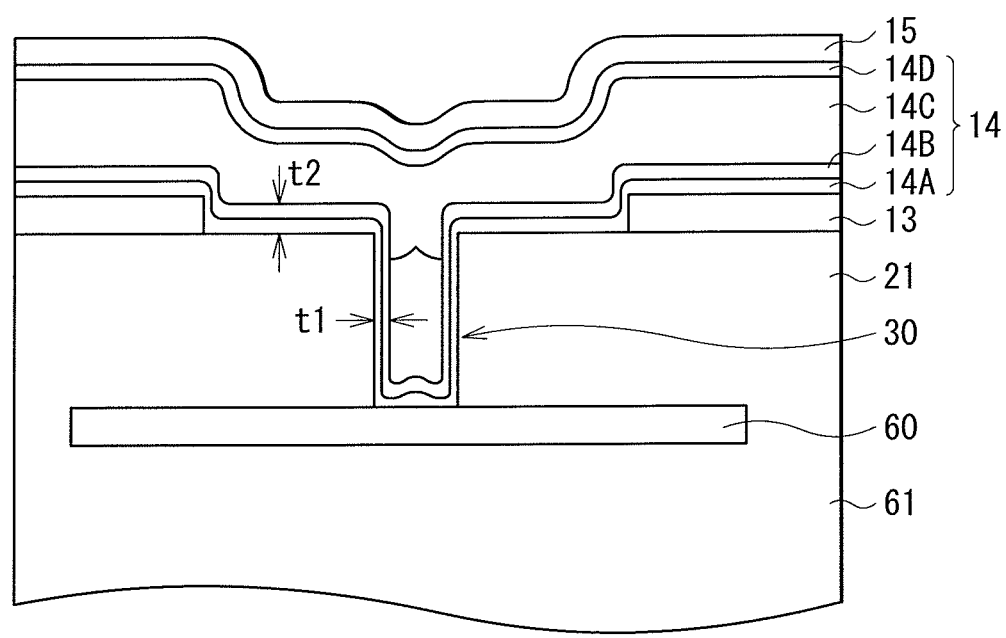
FIG. 35 is a cross-sectional view illustrating an enlarged section in the vicinity of a groove illustrated in FIG. 34.

FIG. 34 illustrates a cross-sectional configuration of part of a display region in a display unit according to a fifth embodiment of the present disclosure. FIG. 35 illustrates an enlarged view of a section in the vicinity of the groove 30 illustrated in FIG. 34. In this embodiment, a conductive film 60 is provided on the bottom surface of the groove 30. By connecting the conductive film 60 to a determined electric potential, drive current leakage between the adjacent organic EL devices 10R, 10G, and 10B is almost totally suppressed. Further, in this embodiment, the second insulating film 22 is omitted, and only the first insulating film 21 is provided as the insulating film 20. Except for such points, the display unit of this embodiment has a similar configuration, a similar function, and a similar effect to those of the first to the third embodiments.

As described above, the conductive film 60 is connected to a determined electric potential such as a ground electric potential and an electric potential (cathode electric potential) of the second electrode 15. Thereby, a leakage current propagated through the hole injection layer 14A and the hole transport layer 14B is short-circuited to the conductive film 60, and a leakage current between the adjacent organic EL devices 10R, 10G, and 10B is almost totally suppressed. The second electrode 15 is connected to an auxiliary wiring (not illustrated) in a region outside the display region 110 for the following reason. That is, since the organic layer 14 is provided commonly to the plurality of organic EL devices 10R, 10G, and 10B, it is not possible to connect the second electrode 15 with the auxiliary wiring for each of the organic EL devices 10R, 10G, and 10B.

The conductive film 60 is made of a conductive material such as titanium nitride (TiN). The conductive film 60 is preferably a light shielding layer that blocks light entrance to the drive transistor Tr1 or the writing transistor Tr2 of the pixel drive circuit 140 of the drive circuit layer 12.

Regarding the planar shape of the groove 30, it is possible that the groove 30 is provided continuously over a plurality of rows of the plurality of organic EL devices 10R, 10G, and 10B as in the first embodiment. Further, it is possible that the groove 30 is provided for each row of the plurality of organic EL devices 10R, 10G, and 10B as in the third embodiment.

The display unit is allowed to be manufactured, for example, as follows. For manufacturing steps similar to those of the first embodiment, a description will be given with reference to FIG. 9 to FIG. 15.

Figure 36A:
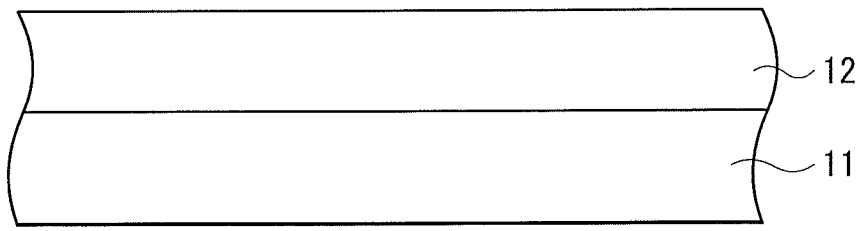
FIGS. 36A to 36D are cross-sectional views illustrating a method of manufacturing the display unit illustrated in FIG. 34 in order of steps.

First, as illustrated in FIG. 36A, the drive circuit layer 12 including the pixel drive circuit 140 is formed on the substrate 11 as in the first embodiment by the step illustrated in FIG. 9.

Figure 36B:
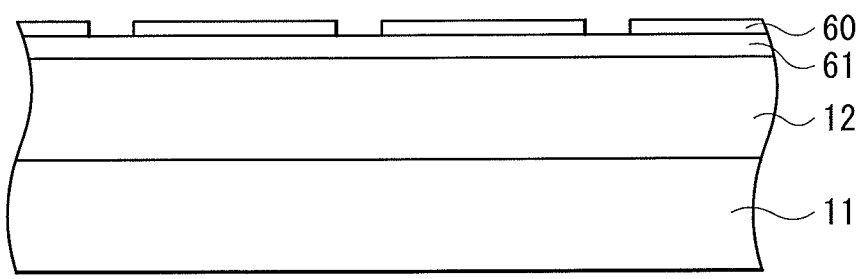

Next, as illustrated in FIG. 36B, an interlayer insulating film 61 is provided on the drive circuit layer 12, and the conducive film 60 made of the foregoing material is formed on the interlayer insulating film 61.

Figure 36C:
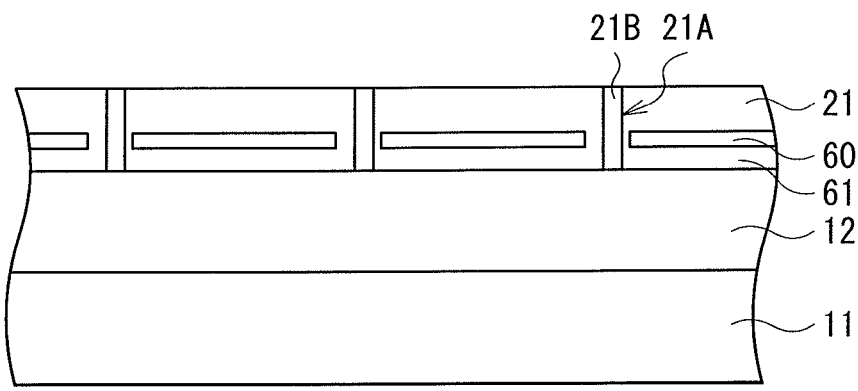

Subsequently, as illustrated in FIG. 36C, the first insulating film 21 having the contact hole 21A is formed on the interlayer insulating film 61 and the conducive film 60 as in the first embodiment by the step illustrated in FIG. 9. After that, as illustrated in FIG. 36C again, the plug 21B is formed in the contact hole 21A.

Figure 36D:
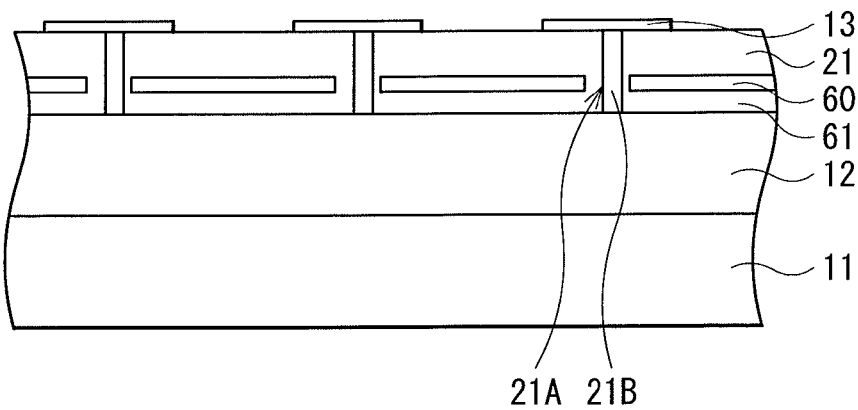

After the first insulating film 21 is formed, as illustrated in FIG. 36D, the first electrode 13 is formed for each of the plurality of organic EL devices 10R, 10G, and 10B on the first insulating film 21 as in the first embodiment by the step illustrated in FIG. 10.

After the first electrode 13 is formed, as illustrated in FIGS. 37A and 37B, the groove 30 is provided in the first insulating film 21 by a photolithography method and etching so that the bottom surface of the groove 30 reaches the conductive film 60.

Figure 38:
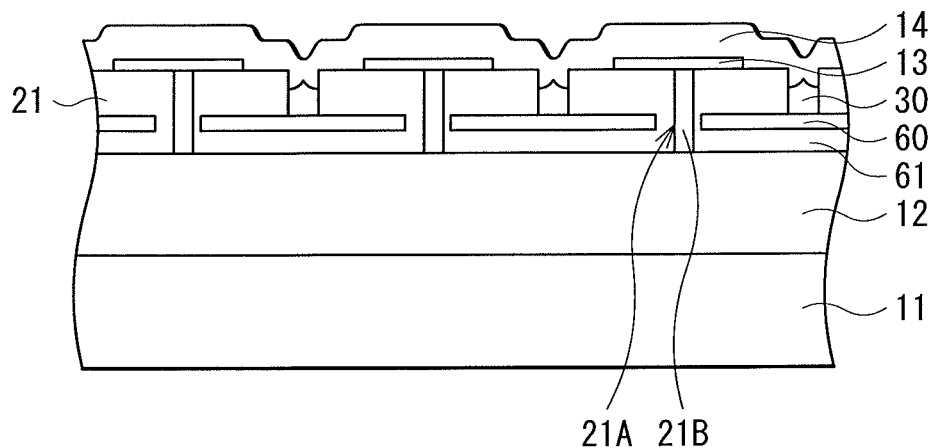
FIG. 38 is a cross-sectional view illustrating a step following the step in FIGS. 37A and 37B.

After the groove 30 is provided, as illustrated in FIG. 38, the hole injection layer 14A, the hole transport layer 14B, the light emitting layer 14C, and the electron transport layer 14D of the organic layer 14 are formed over the first electrode 13 and the second insulating film 22 by, for example, an evaporation method as in the first or the second embodiment by the steps illustrated in FIG. 13 to FIG. 15.

After the organic layer 14 is formed, as illustrated in FIG. 14 and FIG. 15, the second electrode 15 is formed as in the first embodiment. Thereby, the organic EL devices 10R, 10G, and 10B as illustrated in FIG. 3 and FIG. 4 are formed.

Subsequently, as illustrated in FIG. 4, the protective film 16 and the adhesive layer 17 made of the foregoing materials are formed on the organic EL devices 10R, 10G, and 10B as in the first embodiment. The resultant is bonded with the sealing substrate 40 provided with the color filter 41 and the light shielding film 42. Accordingly, the display unit illustrated in FIG. 1 to FIG. 4 is completed.

[Module and Application Examples]

A description will be given of application examples of the display unit described in the foregoing embodiments. The display unit of the foregoing embodiments is applicable to a display unit of an electronic device in any field for displaying a video signal inputted from outside or a video signal generated inside as an image or a video such as a television device, a digital camera, a notebook personal computer, a portable terminal device such as a mobile phone, and a video camcorder.

[Module]

Figure 39:
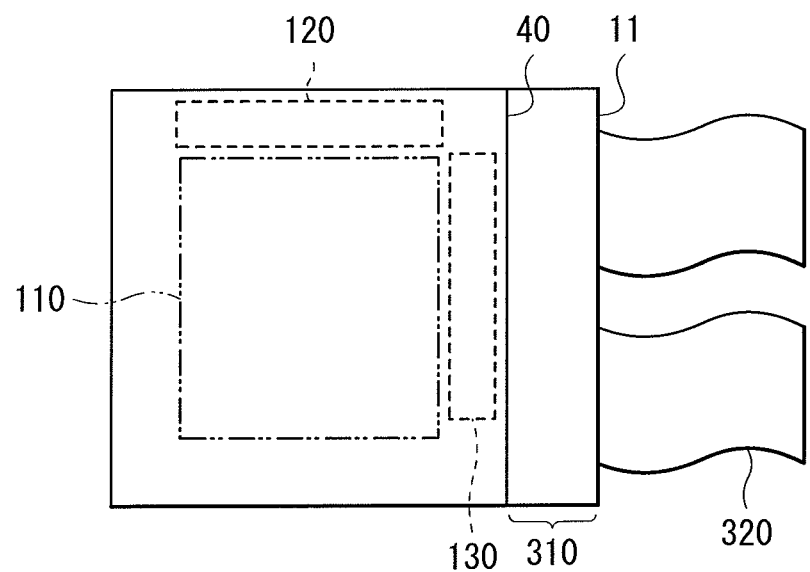
FIG. 39 is a plan view illustrating a schematic configuration of a module including the display unit of the foregoing embodiments.

The display unit of the foregoing embodiment is incorporated in electronic devices such as after-mentioned first and second application examples as a module as illustrated in FIG. 39, for example. In the module, for example, a region 310 exposed from the sealing substrate 40 is provided on a side of the substrate 11, and an external connection terminal (not illustrated) is formed in the exposed region 310 by extending the wirings of the signal line drive circuit 120 and the scanning line drive circuit 130. The external connection terminal may be provided with a flexible printed circuit (FPC) 320 for inputting and outputting a signal.

[First Application Example]

Figure 40A:
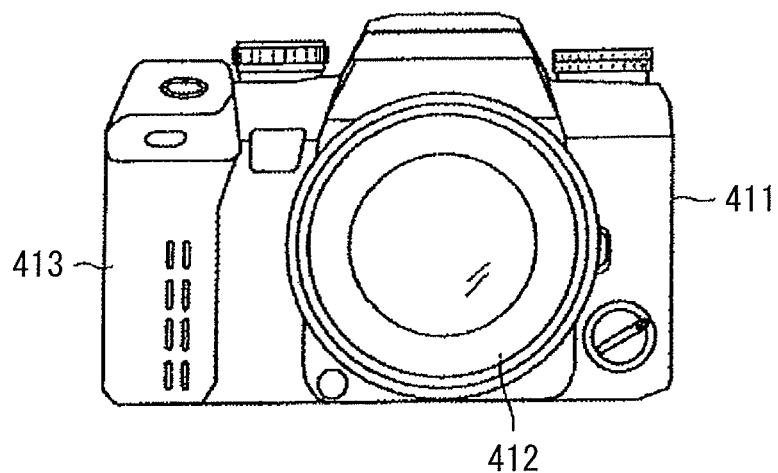
FIGS. 40A and 40B are an elevation view and a rear view illustrating an appearance of a first application example of the display unit of the foregoing embodiments.
Figure 40B:
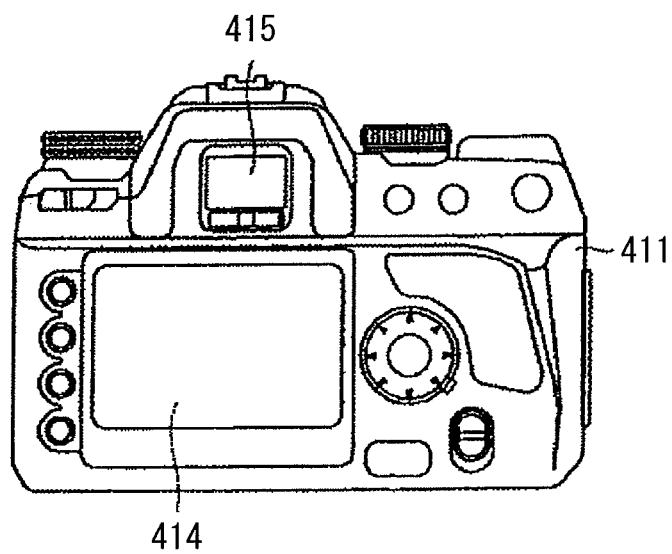

FIGS. 40A and 40B illustrate an appearance of an image pickup device (single-lens reflex digital camera with interchangeable lenses) to which the display unit of the foregoing embodiments is applied. The image pickup device has, for example, an interchangeable image pickup lens unit (interchangeable lens) 412 on the front right side of a camera body 411 and a grip section 413 to be gripped by a photographer on the front left side. In the approximately central section of the rear surface of the camera body 411, a monitor 414 is provided. A viewfinder (eyepiece window) 415 is provided above the monitor 414. The photographer is able to view a subject light figure guided from the image pickup lens unit 412 and determine a picture composition by viewing the image on the viewfinder 415. The viewfinder 415 is composed of the display unit according to the foregoing embodiments.

[Second Application Example]

Figure 41:
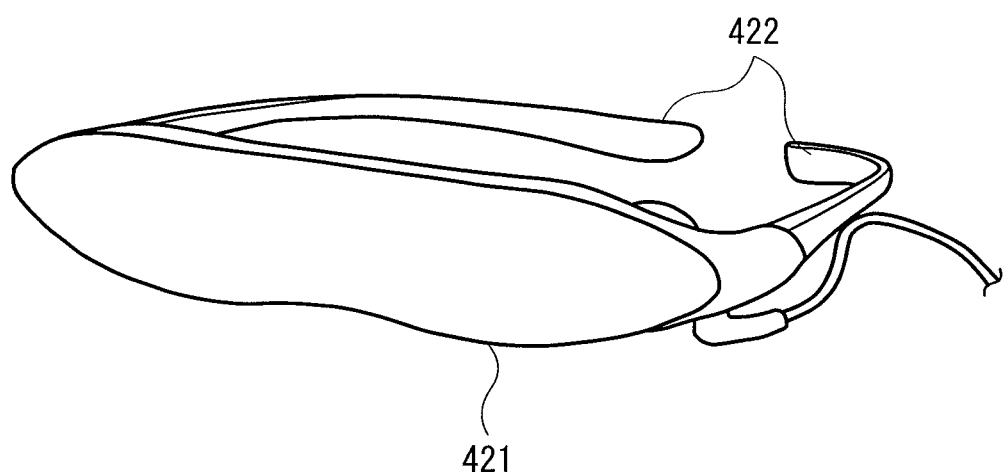
FIG. 41 is a perspective view illustrating an appearance of a second application example.

FIG. 41 illustrates an appearance of a head-mounted display to which the display unit of the foregoing embodiments is applied. The head-mounted display has, for example, an ear-hook section 422 to be worn on a user's head on both sides of an eyeglass-shaped display section 421. The display section 421 is composed of the display unit according to the foregoing embodiments.

While the present disclosure has been described with reference to the embodiments, the present disclosure is not limited to the foregoing embodiments, and various modifications may be made. For example, in the foregoing embodiments, the description has been given of the case that a leakage current between the organic light emitting devices 10R, 10G, and 10B is suppressed by decreasing the thickness inside the groove 30 of the hole injection layer 14A and the hole transport layer 14B. However, it is enough that at least the thickness inside the groove 30 of the hole injection layer 14A or the hole transport layer 14B is decreased. Further, out of the organic layer 14, conductivity of the hole injection layer 14A is particularly high. Therefore, a leakage current between the organic light emitting devices 10R, 10G, and 10B is allowed to be decreased by decreasing at least the thickness inside the groove 30 of the hole injection layer 14A. Further, in the case where the hole transport layer 14B is omitted, a leakage current between the organic light emitting devices 10R, 10G, and 10B is allowed to be decreased by decreasing the thickness inside the groove 30 of the hole injection layer 14A.

Further, in the foregoing embodiments, the description has been given of the case that light generated in the light emitting layer is extracted from the second electrode 15 side (top emission) as an example. However, it is possible that light generated in the light emitting layer is extracted from the first electrode 13 side (bottom emission). In this case, the first electrode 13 is formed of a transparent electrode made of ITO, IZO (registered trademark), $SnO_2$, or the like. The second electrode 15 is formed of a reflecting electrode composed of a simple body or an alloy of a metal element such as gold (Au), platinum (Pt), nickel (Ni), chromium (Cr), copper (Cu), tungsten (W), aluminum (Al), molybdenum (Mo), and silver (Ag). Further, the second electrode 15 may be composed of a composite film of the foregoing reflecting electrode and the foregoing transparent electrode. Further, in the case of the bottom emission type, the color filter 41 and the light shielding film 42 may be provided on the substrate 11 side, for example, may be provided between the drive circuit layer 12 and the first insulating film 21.

Further, for example, the material, the thickness, the film-forming method, the film-forming conditions, and the like of each layer are not limited to those described in the foregoing embodiments, and other material, other thickness, other film-forming method, and other film-forming conditions may be adopted.

It is possible to achieve at least the following configurations from the above-described exemplary embodiments and the modifications of the disclosure.

(1) A display unit comprising, on a substrate:
a plurality of organic EL devices; and
an insulating film provided in an inter-device region between the plurality of organic EL devices, the insulating film including a groove in a position between the organic EL devices adjacent to each other.

(2) The display unit according to (1), wherein the organic EL device includes
a first electrode provided for each of the plurality of organic EL devices,
an organic layer being provided on the first electrode and the insulating film commonly to the plurality of organic EL devices, and including a hole injection layer or a hole transport layer and a light emitting layer, and
a second electrode being provided on the organic layer commonly to the plurality of organic EL devices, and
thickness inside the groove of the hole injection layer or of the hole transport layer is smaller than thickness outside the groove thereof.

(3) The display unit according to (2), wherein the thickness inside the groove of the hole injection layer or of the hole transport layer becomes smaller toward a depth direction of the groove.

(4) The display unit according to any one of (1) to (3), wherein the plurality of organic EL devices have a rectangle shape extending in one direction, and are arranged in a row direction parallel with a short side thereof and in a column direction parallel with a long side thereof, and
the groove is provided continuously over a plurality of rows of the plurality of organic EL devices in the column direction.

(5) The display unit according to any one of (1) to (3), wherein the plurality of organic EL devices have a rectangle shape, and are arranged in a row direction parallel with a short side thereof and in a column direction parallel with a long side thereof, and
the groove is provided for each row of the plurality of organic EL devices in the column direction.

(6) The display unit according to (4) or (5), wherein pitch in the row direction of the plurality of organic EL devices is equal to or smaller than about 30 μm.

(7) The display unit according to any one of (1) to (6), wherein the insulating film includes a first insulating film and a second insulating film, the first insulating film being provided between the substrate and the plurality of organic EL devices, and the second insulating film being provided in the inter-device region on the first insulating film, and
the groove includes a first groove and a second groove, the first groove being provided in the first insulating film, and the second groove being provided in the second insulating film, communicating with the first groove, and having width narrower than width of the first groove.

(8) The display unit according to any one of (2) to (6), including a conductive film on a bottom surface of the groove,
wherein the conductive film is connected to a determined electric potential.

(9) The display unit according to (8), wherein the determined electric potential is a ground electric potential or an electric potential of the second electrode.

(10) The display unit according to (8) or (9) comprising:
a drive circuit including a transistor between the substrate and the plurality of organic EL devices, and between the substrate and the insulating film,
wherein the conductive film is a light shielding layer.

(11) The display unit according to any one of (1) to (10), wherein the light emitting layer is a white light emitting layer, and
the organic EL device includes a color filter extracting the white light as red light, green light, or blue light.

(12) A method of manufacturing a display unit, the method comprising:
forming a plurality of organic EL devices on a substrate; and
forming an insulating film in an inter-device region between the plurality of organic EL devices,
wherein in the forming of the insulating film, a groove is provided in a position between the organic EL devices adjacent to each other of the insulating film.

(13) The method of manufacturing a display unit according to (12), wherein the forming of the plurality of organic EL devices includes
forming a first electrode for each of the plurality of organic EL devices,
forming an organic layer including a hole injection layer or a hole transport layer and a light emitting layer commonly to the plurality of organic EL devices on the first electrode and the insulating film, and
forming a second electrode commonly to the plurality of organic EL devices on the organic layer, and
wherein the forming of the organic layer is performed after providing the groove in the insulating film.

(14) The method of manufacturing a display unit according to (13), wherein in the forming of the organic layer is performed by an evaporation method, and Mathematical expression 1 is satisfied, $$X/Y > w/d \qquad \text{(Mathematical expression 1)}$$

where X represents offset distance from an entrance edge of the groove to an evaporation source, Y represents distance between the substrate and the evaporation source, w represents width of the groove, and d represents depth of the groove.

(15) The method of manufacturing a display unit according to (14), wherein in the forming of the organic layer, the evaporation method is a rotary evaporation method in which film formation is performed while the substrate is rotated, and the Mathematical expression 1 is satisfied during part or all of a time period in which the substrate is rotated once.

(16) The method of manufacturing a display unit according to (14), wherein in the forming of the organic layer, the evaporation method is a linear evaporation method in which film formation is performed while the evaporation source and the substrate are relatively moved in one direction, and the Mathematical expression 1 is satisfied during part or all of a time period in which the substrate passes the evaporation source.

(17) The method of manufacturing a display unit according to any one of (14) to (16), wherein in the forming of the hole injection layer or the hole transport layer out of the organic layer, the Mathematical expression 1 is satisfied.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display unit comprising, on a substrate:
a plurality of organic EL devices; and
an insulating film provided in an inter-device region between the plurality of organic EL devices, the insulating film including a groove in a position between the organic EL devices adjacent to each other, wherein the organic EL devices include:
a first electrode provided for each of the plurality of organic EL devices,
an organic layer being provided on the first electrode and the insulating film commonly to the plurality of organic EL devices, and including a hole injection layer or a hole transport layer and a light emitting layer, and
a second electrode being provided on the organic layer commonly to the plurality of organic EL devices, and
wherein a thickness inside the groove of the hole injection layer or of the hole transport layer is smaller than a thickness outside the groove thereof.

2. The display unit according to claim 1, wherein the thickness inside the groove of the hole injection layer or of the hole transport layer becomes smaller toward a depth direction of the groove.

3. The display unit according to claim 2, including a conductive film on a bottom surface of the groove,
wherein the conductive film is connected to a determined electric potential.

4. The display unit according to claim 3, wherein the determined electric potential is a ground electric potential or an electric potential of the second electrode.

5. The display unit according to claim 3 comprising:
a drive circuit including a transistor between the substrate and the plurality of organic EL devices, and between the substrate and the insulating film,
wherein the conductive film is a light shielding layer blocking light.

6. The display unit according to claim 1, including a conductive film on a bottom surface of the groove,
wherein the conductive film is connected to a determined electric potential.

7. The display unit according to claim 6, wherein the determined electric potential is a ground electric potential or an electric potential of the second electrode.

8. The display unit according to claim 6 comprising:
a drive circuit including a transistor between the substrate and the plurality of organic EL devices, and between the substrate and the insulating film,
wherein the conductive film is a light shielding layer blocking light.

9. The display unit according to claim 1, wherein the light emitting layer is a white light emitting layer, and
the organic EL device includes a color filter extracting the white light as red light, green light, or blue light.

10. The display unit according to claim 1, wherein the plurality of organic EL devices have a rectangle shape extending in one direction, and are arranged in a row direction parallel with a short side thereof and in a column direction parallel with a long side thereof, and
wherein the groove is provided continuously over a plurality of rows of the plurality of organic EL devices in the column direction.

11. The display unit according to claim 1, wherein the plurality of organic EL devices have a rectangle shape, and are arranged in a row direction parallel with a short side thereof and in a column direction parallel with a long side thereof, and
wherein the groove is provided for each row of the plurality of organic EL devices in the column direction.

12. The display unit according to claim 1, wherein the insulating film includes a first insulating film and a second insulating film, the first insulating film being provided between the substrate and the plurality of organic EL devices, and the second insulating film being provided in the inter-device region on the first insulating film, and
wherein the groove includes a first groove and a second groove, the first groove being provided in the first insulating film, and the second groove being provided in the second insulating film, communicating with the first groove, and having a width narrower than a width of the first groove.

13. A display unit comprising, on a substrate:
a plurality of organic EL devices; and
an insulating film provided in an inter-device region between the plurality of organic EL devices, the insulating film including a groove in a position between the organic EL devices adjacent to each other, wherein the plurality of organic EL devices have a rectangle shape extending in one direction, and are arranged in a row direction parallel with a short side thereof and in a column direction parallel with a long side thereof, and
wherein the groove is provided continuously over a plurality of rows of the plurality of organic EL devices in the column direction.

14. The display unit according to claim 13, wherein a pitch in the row direction of the plurality of organic EL devices is equal to or smaller than about 30 μm.

15. The display unit according to claim 13, including a conductive film on a bottom surface of the groove,
wherein the conductive film is connected to a determined electric potential.

16. A display unit comprising, on a substrate:
a plurality of organic EL devices; and
an insulating film provided in an inter-device region between the plurality of organic EL devices, the insulating film including a groove in a position between the organic EL devices adjacent to each other, wherein the plurality of organic EL devices have a rectangle shape, and are arranged in a row direction parallel with a short side thereof and in a column direction parallel with a long side thereof, and
wherein the groove is provided for each row of the plurality of organic EL devices in the column direction.

17. The display unit according to claim 16, including a conductive film on a bottom surface of the groove,
wherein the conductive film is connected to a determined electric potential.

18. A display unit comprising, on a substrate:
a plurality of organic EL devices; and
an insulating film provided in an inter-device region between the plurality of organic EL devices, the insulating film including a groove in a position between the organic EL devices adjacent to each other, wherein the insulating film includes a first insulating film and a second insulating film, the first insulating film being provided between the substrate and the plurality of organic EL devices, and the second insulating film being provided in the inter-device region on the first insulating film, and
wherein the groove includes a first groove and a second groove, the first groove being provided in the first insulating film, and the second groove being provided in the second insulating film, communicating with the first groove, and having a width narrower than a width of the first groove.

* * * * *